(12) United States Patent
Okamoto et al.

(10) Patent No.: US 8,048,614 B2
(45) Date of Patent: Nov. 1, 2011

(54) SEMICONDUCTOR INTEGRATED CIRCUIT DEVICE FABRICATION METHOD

(75) Inventors: Yoshihiko Okamoto, Kikugawa (JP); Masami Ogita, Hamamatsu (JP)

(73) Assignee: Yoshihiko Okamoto, Kikugawa-shi (JP)

( * ) Notice: Subject to any disclaimer, the term of this patent is extended or adjusted under 35 U.S.C. 154(b) by 1081 days.

(21) Appl. No.: 11/463,467

(22) Filed: Aug. 9, 2006

(65) Prior Publication Data

US 2007/0117409 A1    May 24, 2007

(30) Foreign Application Priority Data

Feb. 5, 2004 (JP) .............................. JP2004-031528

(51) Int. Cl.
*H01L 21/00* (2006.01)

(52) U.S. Cl. .............. 430/311; 430/5; 430/24; 430/317; 430/329; 430/396; 355/35; 355/52; 355/53; 355/77; 438/975; 438/976; 438/780

(58) Field of Classification Search ................ 430/5, 24, 430/311, 317, 322, 329, 396; 355/35, 52, 355/53, 77; 438/975, 976, 780; 716/21
See application file for complete search history.

(56) References Cited

U.S. PATENT DOCUMENTS

| 4,480,910 | A | * | 11/1984 | Takanashi et al. | ............... | 355/30 |
| 5,521,032 | A | * | 5/1996 | Imai et al. | .......................... | 430/5 |
| 6,867,845 | B2 | * | 3/2005 | Kanda | ............................. | 355/52 |
| 7,361,960 | B1 | * | 4/2008 | Tsunashima et al. | ......... | 257/380 |

FOREIGN PATENT DOCUMENTS

| JP | 63-295350 | 5/1990 |
| JP | 03-137511 | 12/1992 |
| JP | 08-052997 | 10/1996 |
| JP | 10-303114 | 12/2000 |

OTHER PUBLICATIONS

M. Hoga et al, 'Photo the mask gijutu no hanashi', Kougyou Chousakai KK, pp. 235-240, Aug. 20, 1996.

* cited by examiner

*Primary Examiner* — Thorl Chea
(74) *Attorney, Agent, or Firm* — Apex Juris, pllc; Tracy M. Heims

(57) ABSTRACT

A circuit pattern having a size finer than a half of a wavelength of an exposure beam is transferred on a semiconductor wafer plane with an excellent accuracy by means of a mask whereupon an integrated circuit pattern is formed and a reduction projection aligner. The accuracy of transferring the circuit pattern on the semiconductor wafer is improved by synergic effects of super-resolution exposure, wherein a mask cover made of a transparent medium is provided on a pattern side of the integrated circuit mask so as to suppress the aberration of reduction projection alignment, and a method of increasing the number of actual apertures of the optical reduction projection lens system provided with the wafer cover made of the transparent medium on a photoresist side of the semiconductor wafer to which planarizing process is performed.

7 Claims, 19 Drawing Sheets

(a) (b)    (c)    (d)

0.001 micron rms   0.0008  waves

PV    0.0044  waves

Lam   248.00  nm

SEMICONDUCTOR INTEGRATED CIRCUIT DEVICE FABRICATION METHOD

This application is a 371 National Stage Application into United States based on previously filed Japanese patent application JP2004-031528 filed on Feb. 9, 2004 and Patent Cooperation Treaty Application PCT/JP2005/001669, filed Feb. 4, 2005.

TECHNICAL FIELD OF THE INVENTION

The present invention relates to a method of manufacturing a semiconductor integrated circuit device, a method of the exposure technology and more particularly, to a technology which is effective if applied to the photolithography process of a semiconductor integrated circuit device.

BACKGROUND OF THE INVENTION

As an integrated circuit pattern has become a very narrow pattern, forming a circuit pattern of the narrower dimension than halves of the exposure wavelengths has to study in lithography technology field, where an integrated circuit pattern formed on the mask is printed onto a semiconductor wafer with ultra violet exposure light.

For example, a reference of "Photo mask gijutu no hanashi', Kougyouchousakai K. K. pp. 236-240, 1996" discloses as follows: Optical Proximity Correction technology prevents the decline of a printing accuracy to a semiconductor wafer of an integrated circuit pattern, and accuracy of integrated circuit pattern is possible to increase by correcting of circuit pattern formed on the mask.

Japanese Patent Publication No. 2710967 invented by this inventor discloses a phase shift technology which is improved resolution of printing the integrated circuit pattern on a semiconductor wafer. This is using a dark line of light interference of transmitted light by a phase difference of light set on the mask.

Japanese Patent Publication No. 2634037 discloses an exposure technology, which is improved resolution of printing the integrated circuit pattern on a semiconductor wafer. This technique uses an off-axis illumination of exposure light limited on the mask illumination.

Japanese Patent Laid-Open No. 10-303114 discloses a liquid immersion exposure equipment which does not lead to deterioration of the image performance for fine pattern by filling the room between the reduced projection lens and wafer with liquid.

Japanese Patent Publication No. 3120474 invented by this inventor discloses a projection exposure method using a phase shift mask, which is formed by overlapping an opaque pattern substrate and a phase shifter pattern substrate.

Related Japanese Patent Documents
  (1) Japanese Patent Publication No. 2710967
  (2) Japanese Patent Publication No. 2634037
  (3) Japanese Patent Laid-Open No. 10-303114
  (4) Japanese Patent Publication No. 3120474
  Other References
M. Hoga et al, 'Photo the mask gijutu no hanashi', Kougyou Chousakai K K, pp. 235-240, Aug. 20, 1996
The subject which invention tries to solve.

A semiconductor integrated circuit device has been becoming more higher integration without stopping. Minimum pattern size of semiconductor circuit of large volume production device has become narrower than 100 nm pattern.

The reduced projection exposure method has formed circuit patterns. This exposure method cannot cope with progress of integrated circuit device any more, because shorting of exposure light wavelength and enlarging of numerical aperture of projection lens have become very difficult. The technique until now cannot be taken any more. Using the above mentioned phase shift technique, it is said to cope with pattern size to the half of exposure wavelength, but it is very difficult for narrower pattern.

The exposure technology disclosed in Japanese Patent Publication No. 3120474 had problems of both increasing printed pattern deformation and miss-matching of forming a narrow pattern. This reason is a phase shift mask fabricated by overlapping an opaque pattern and a phase shift pattern.

A liquid immersion exposure equipment disclosed in Japanese Patent Laid-Open No. 10-303114 had problems of both generating of bubbles in liquid and changing of liquid temperature during exposure. And it has practical problems of photosensitive resist material and developer material.

A reduced projection exposure equipment is repeating exposure steps after changing position between projection lens and wafer surface. Then, solid material of immersion method cannot change position between a projection lens and a wafer surface, instead of liquid material.

An object of the present invention is to provide a reduced projection exposure method, which is possible to manufacture a semiconductor integrated circuits device whose circuit pattern size is less than half of exposure wavelength.

Another objective of this invention is to provide an exposure method, which is possible to printing a very narrow pattern on a semiconductor wafer, by both increasing numerical aperture of projection lens and reducing optical phase difference between ideal wave-front and actual wave-front.

Another objective of this invention is to provide a reduced projection exposure equipment for printing circuit pattern on the mask to semiconductor wafer. And another objective of this invention is to provide a mask for a semiconductor fabrication process.

Another objective of this invention is to provide a high efficient semiconductor fabrication technology by lowering investment of both development and fabrication of a semiconductor device.

Another objective of this invention is to provide a forming method of very narrow pattern which pattern size is narrower than exposure wavelength, by overcoming surface roughness of both an insulator film and a conductor film on a semiconductor wafer.

Another objective of this invention is to provide a method of forming a circuit pattern whose pattern size is narrower than exposure wavelength, by solving problems of both micro bubbles and liquid temperature in the liquid immersion exposure.

Another objective of this invention is to provide a circuit design method of reduced cost for a new fine circuit development.

Another objective of this invention is to provide a exposure method of reduced mask fabrication cost, by using an opaque mask instead of a phase-shift mask.

The above-mentioned objects and other objects of the present invention, and new features thereof will be apparent from the description of the present specification and attached drawings.

SUMMARY OF THE INVENTION

A summary of typical aspects of the present invention disclosed in the present application is as follows. Now, the first invention is an exposure technology, wherein a reduced projection exposure method is performed using both a mask cover and a wafer cover. The mask cover contacts on the surface of an integrated circuit the mask. The wafer cover contacts on a photosensitive resist over a semiconductor wafer.

Exposure light illuminates on the mask through the mask cover, a projection lens and the wafer cover, and exposed a photosensitive resist film on the semiconductor wafer. The circuit pattern is formed by developing photosensitive resist, after removing wafer cover.

The second invention is an exposure technology, wherein a reduced projection exposure is performed by suppressing aberration, using the mask with the mask cover of fixed thickness in order to form a very narrow pattern.

A summary of typical other aspects of the present invention disclosed in the present application is as follows.

Another invention is a reduced projection exposure equipment, wherein circuit pattern on the mask is printing on a photosensitive resist over a semiconductor wafer using both a projection lens cover and a wafer cover. The wafer cover contacts to a photosensitive resist film. Moreover, the wafer cover consists of transparent liquid. The lens cover consists of a glass plate.

Exposure light of the above exposure equipment illuminates on the mask through a mask cover, a projection lens and a wafer cover, and exposed a photosensitive resist film on a semiconductor wafer.

Another invention is an exposure technology, wherein reduced projection exposure is performing an additional reduction of circuit pattern on semiconductor wafer using a conventional mask.

A method of additional reduction is to be moved on optical axis direction of either a mask position, a wafer position, or a correction lens position of reduced projection lens.

By using wafer cover contacted photosensitive resist, it is possible to print an additional reduction of circuit pattern. Exposure light is illuminated on a mask through a mask cover, a projection lens and a wafer cover, and exposed a photosensitive resist film on a semiconductor wafer.

Another invention is a reduced projection exposure equipment, wherein circuit pattern on a mask is printing on a photosensitive resist film over a semiconductor wafer by both next first function and second function.

The first function is an exposure function of a photosensitive resist over semiconductor wafer by using a wafer cover contacted to a photosensitive resist surface. Exposure light illuminates on a mask through a projection lens and a wafer cover, and exposes a photosensitive resist film on a semiconductor wafer.

The second function is an exposure function of a photosensitive resist film over a semiconductor wafer without the above wafer cover. Exposure light illuminates on a mask through a projection lens, and exposes a photosensitive resist film on a semiconductor wafer.

Another invention is a exposure technology, wherein a projection exposure is possible to print a fine pattern by using both an exposure of off-axis illumination and a wafer cover contacted photosensitive resist. In order to expose a fine pattern, off-axis illumination has to be set to an angle of illuminating light corresponding to both pattern directions and pattern pitches of the circuit the mask.

Exposure light illuminates on a mask through a projection lens and a wafer cover, and exposes a photosensitive resist film on a semiconductor wafer. Exposure light becomes short wavelength onto the wafer cover material. A fine pattern less than half the exposure light can be formed by super resolution of off-axis illumination.

Another invention is a manufacturing method of a semiconductor device, wherein circuit pattern is formed by using both with a wafer cover and without a wafer cover. Under the pattern formation process using a wafer cover, exposure light is illuminated on a mask through a projection lens and a wafer cover, and exposed a photosensitive resist film on a semiconductor wafer. Circuit pattern on the semiconductor is formed by developing photosensitive resist, after removing a wafer cover. Under the pattern formation process without a wafer cover, exposure light is illuminated on a mask through a projection lens, and exposed a photosensitive resist film on a semiconductor wafer. Circuit pattern on the semiconductor is formed by developing a photosensitive resist.

Another invention is an exposure technology, wherein circuit pattern is formed by using both a circuit the mask with phase shifting pattern and a reduced projection exposure with a wafer cover contacted to photosensitive resist surface. A reduced projection exposure method has high possibility of printing on a semiconductor wafer by using both a phase shift mask effect and a shortening effect of exposure wavelength of a wafer cover for a fine circuit pattern which is narrower than half the exposure wavelength. The phase shift mask uses light interference of which the phase of exposure light is partially inverted. After exposure light passes through the mask, a projection lens and a wafer cover, an integrated circuit pattern is printed on a photosensitive resist film of a semiconductor wafer, using interference of the mask passing light. After removing a wafer cover, circuit pattern is formed by developing a photosensitive resist.

Another invention is a reduced projection exposure equipment which has means of both off-axis illumination and a wafer cover, in order to print a fine circuit pattern onto photosensitive resist film over a semiconductor wafer. Means of off-axis illumination on the mask is illuminated on a mask with an optimized angle corresponding to pattern directions and pattern pitches of the mask pattern.

An exposure method using both a wafer cover and off-axis illumination without phase difference on the mask has possibility of forming a fine pattern which is near of resolution limit by optical exposure. Exposure light is illuminated on a mask through a projection lens and a wafer cover, and exposed a photosensitive resist film on a semiconductor wafer. Circuit pattern on a semiconductor wafer is formed by developing photosensitive resist, after removing wafer cover.

Another invention is a manufacturing method of the semiconductor device, wherein circuit pattern is formed on an insulator film using a wafer cover which contacts to a photosensitive resist film. The insulator film on semiconductor wafer is smoothed by using chemical mechanical polishing (CMP) or chemical mechanical lapping (CML). Exposure light is illuminated on a mask through a projection lens and a wafer cover, and exposed a photosensitive resist film on a semiconductor wafer. An insulator film pattern is formed by developing a photosensitive resist film after removing a wafer cover. A fine pattern can be formed because influence of surface roughness of an insulator film is little.

Another invention is a manufacturing method of the semiconductor device, wherein circuit pattern is formed on a conductor film using a wafer cover which contacts to a photosensitive resist film. The conductor film on semiconductor wafer is smoothed by using chemical mechanical polishing (CMP) or chemical mechanical lapping (CML). Exposure light is illuminated on a mask through a projection lens and a wafer cover, and exposed a photosensitive resist film on a semiconductor wafer. A conductor film pattern is formed by developing a photosensitive resist film after removing a wafer cover.

A fine pattern can be formed because influence of surface roughness of a conductor film is little.

Another invention is an exposure technology, wherein reduced projection exposure is performed by using both a specific design the mask and a wafer cover contacted photosensitive resist. The mask is designed for a specific wavelength of exposure lights of 193 nm, 157 nm. And the mask is designed for a specific case that numerical aperture of the reduced projection lens is more than 1.

Exposure light whose wavelength is the same as the design the mask is illuminated on the mask through a projection lens and a wafer cover, and exposed a photosensitive resist film on a semiconductor wafer. A circuit pattern is formed by developing a photosensitive resist film after removing a wafer cover.

Another invention is an exposure technology, wherein reduced projection exposure is performed by using both a specific circuit pattern the mask and a wafer cover contacted to photosensitive resist. The mask is fabricating using a specific data conversion from circuit pattern of conventional integrated circuit device.

The circuit pattern of conventional integrated circuit device consists of circuit pattern formed using an exposure equipment of numerical aperture less than 1. Integrated circuit the mask for a very fine pattern with projection exposure and a wafer cover is fabricated from a specific data conversion of conventional circuit pattern data. Exposure light is illuminated on a mask through a projection lens and a wafer cover, and exposed a photosensitive resist film on a semiconductor wafer. A circuit pattern is formed by developing a photosensitive resist film after removing a wafer cover.

Another invention is a reduced projection exposure method with both a wafer cover contacted to photosensitive resist film and a specific opaque mask. The opaque mask is fabricated from a specific data conversion of conventional circuit pattern data of the phase shift mask. A circuit pattern is formed by developing a photosensitive resist film after removing a wafer cover.

A summary of typical aspects of the present invention disclosed in the present application is as follows.

According to the present invention, when an integrated circuit pattern is formed on a wafer, a mask and a reduced projection exposure equipment are used, by suppressing an aberration problem of projection exposure with both a mask cover contacted to circuit pattern of a mask and a wafer cover contacted to a photosensitive resist film over a wafer. Thereby the high accuracy circuit pattern is printed onto the semiconductor wafer.

According to the present invention, when a very fine pattern is formed on a wafer, a super resolution exposure method of either a phase shift mask exposure or a off-axis exposure is used. Further a wafer cover exposure method is used, by using synergy effect of both increasing resolution of the mask and shortening exposure wavelength on the wafer cover, thereby printing the fine pattern whose size is narrower than the half of exposure wavelength.

The present invention is a reduced projection exposure method using a wafer cover contacted to a photosensitive resist over a wafer, and by a narrow gap between the projection lens and the wafer cover, the projection lens is possible to change positions on the wafer. The effect of the wafer cover is increasing a resolution of printing pattern by using the projection lens. The cost of exposure equipment is suppressed by reducing the cost of the most expensive projection lens.

Investment of the exposure equipment user is also suppressed by both exposure with a wafer cover and exposure without a wafer cover. Then, the cost of the semiconductor devices fabrication is suppressed.

According to the present invention, when an integrated circuit pattern is formed on a insulator film, by using planarizing process of insulator film over a wafer, a mask and a reduced projection exposure equipment with a wafer cover are used, thereby printing the fine pattern of an insulator film whose size is narrower than the exposure wavelength onto the wafer. It might be effective under the conditions of using the same exposure wavelength, same projection lens, and same photosensitive resist.

According to the present invention, when an integrated circuit pattern is formed on a conductor film, by using planarizing process of conductor film over a wafer, the mask and the reduced projection exposure equipment with a wafer cover are used, thereby printing the fine pattern of an conductor film whose size is narrower than the exposure wavelength onto the wafer. It might be effective under the conditions of using the same exposure wavelength, same projection lens, and same photosensitive resist. Then, the developing cost and fabricating cost of the semiconductor devices can be reduced.

The present invention is a reduced projection exposure method, by using both a wafer cover on a photosensitive resist over a wafer and a specified mask, thereby the more fine patterns are printed on a semiconductor wafer. The specified mask is formed a fine circuit pattern which is near limit resolution when a conventional reduced projection exposure equipment is used. Then, the developing cost and fabricating cost of the semiconductor devices are reduced.

And the present invention is a reduced projection exposure method using both a wafer cover on a photosensitive resist over a wafer and a specified mask, thereby developing cost of the semiconductor devices is reduced. The specified mask is formed a circuit pattern which was already developed. Then, the developing cost of the semiconductor devices is reduced.

As minimizing of circuit pattern, the distortion of projection exposure is increasing. It is possible to suppress this distortion by using a wafer cover.

Then, the above method is possible to simplifying the mask data formation and optical proximity of the mask pattern data. A fine pattern the mask used the above exposure method is possible to form by shortening mask exposure time and simplifying mask inspection. Then, the cost of semiconductor fabrication is possible to reduce.

Conventional immersion exposure had restrictions of resist material, and developer, because photosensitive resist on semiconductor wafer has to be in the liquid. A wafer cover exposure method can be used a conventional photosensitive resist. It is possible to reduce a developing cost of semiconductor fabrication.

And yield of the semiconductor device fabrication is possible to increase, by adopting a structure that particles on a wafer cover does not print on several photosensitive resist film over semiconductor wafers.

And fabrication cost of the semiconductor device is possible to reduce by using both an opaque mask and exposure method with a wafer cover instead of conventional phase shift exposure method.

BRIEF DESCRIPTION OF THE DRAWINGS

FIG. 1:
EXP: reduced projection exposure equipment;
E1: light source;
E2: mirror;
E3: condenser lens;
E4: masking blade;
E5: alignment mechanism;
E6: XYZ mask move stage for mask;
E7: reduced projection lens;
E8: XYZ wafer move stage;
E9: sensors for both magnitude correction and focus correction;
M1: mask;
M2: mask cover;
W1: semiconductor wafer;
W2: wafer cover.
FIG. 2:
(a) mask pattern;
(b) mask cover;
(c) projection lens;
(d) image plane.
FIG. 6:
M1: mask;
E7: reduced projection lens;
W1: semiconductor wafer;
W2: wafer cover;
E11: wafer loader;
E12: wafer cover loader;
E13: mask loader.
FIG. 7:
M1: mask;
E7: reduced projection lens;
W1: semiconductor wafer;
W2: wafer cover;
W3: photosensitive resist;
B1: off-axis illumination;
B2: order refraction light;
B3: −1 order refraction light.
FIG. 8:
M1: mask;
E7: reduced projection lens;
E8: XYZ wafer move stage;
W1: semiconductor wafer;
W2: wafer cover;
W4: semiconductor chip of additional reduced projection exposure;
W5: semiconductor chip of conventional reduced projection exposure.
FIG. 9:
M1: mask;
M2: mask cover;
M3: opaque metal film;
M4: measurement pattern of print magnification;
M5: reticle alignment mark;
M6: chip alignment mark;
M7: focus adjustment pattern;
M8: circuits pattern for print;
M9: barcode or mask ID of device name and process name.
FIG. 10:
M1: mask;
M2: mask cover;
M11: resist;
M12: chrome film;
M13: quartz glass substrate;
MP1: resist courting process;
MP2: electron beam exposure process, developing process;
MP3: chrome film etching process, resist removing process;
MP4: cover glass;
MP5: anti-refraction film courting process;
MP6: cover glass overlapping process.
FIG. 19:
M1: mask;
E7: reduced projection lens;
W1: semiconductor wafer;
W2: wafer cover;
E8: XYZ wafer move stage.

Figure 1:
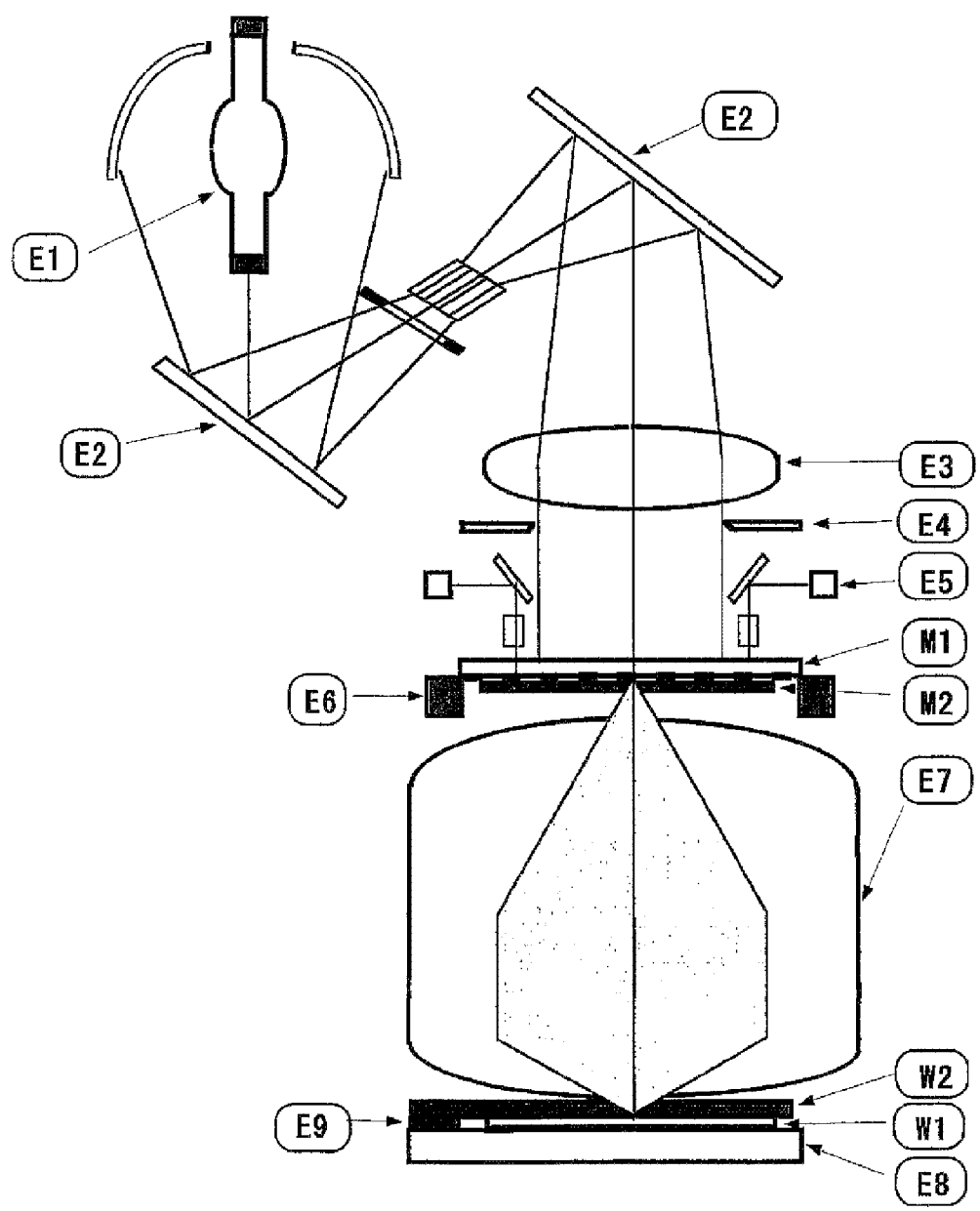
FIG. 1 is a diagram showing the whole structure of a mask, a reduced projection exposure equipment, a semiconductor wafer which is disposed in an exposure system according to the 1st embodiment of the present invention.

The meanings of terms used in the present application will be described before the present invention is described in detail.

Semiconductor Wafer: a silicon mono-crystal substrate used to produce an integrated circuit; a sapphire substrate; a glass substrate; other insulating, anti-insulating or semiconductor substrates; a composite substrate made of two or more thereof; and the like. Semiconductor integrated circuit devices referred to in the present application include not only semiconductor integrated circuit devices formed on a semiconductor or an insulator substrate such as a silicon wafer or a sapphire substrate, but also semiconductor integrated circuit devices formed on some other insulator substrate.

Mask: a member in which a shading pattern for blocking off light or a pattern for changing the phase of light is formed on a mask substrate. The term also indicates a reticle in which a pattern having a size several times actual size is formed.

Halftone mask: a kind of phase shift mask. The halftone mask has a halftone film which has a halftone film use both as a phase sifting film and a shading film, and having a transmissivity of 1% or more and less than 40%, and which has an amount of phase shift, when compare to portion which have no transmissivity, which causes the phase of light to be reversed.

Reduced projection exposure equipment: an exposure equipment for transferring a circuit pattern of a mask onto a wafer. It includes an exposure equipment by scanning an exposure band, relatively to the wafer and the mask (Scanner), or an exposure equipment by stepping the wafer repeatedly to a projected image of the circuit pattern of the mask (Stepper).

Light source of exposure equipment: monochromatic light such i-line (wavelength: 365 nm), KrF (wavelength: 248 nm), ArF (wavelength: 193 nm), F2 (wavelength: 157 nm). These exposure light are called ultra violet light, or vacuum ultraviolet light.

The following description of the embodiments of the present invention will be divided into a plurality of items for conveniences, but the individual embodiments belong not to different inventions but to portions or modifications of a step relating to a single invention. Therefore, any overlapped portion will not be described unless otherwise necessary. Moreover, the reference to be used in the following embodiments designate the parts performing identical or similar functions, unless otherwise specified.

The 1st Embodiment

In the 1st embodiment, there will be described a pattern formation technique of integrated circuit on a semiconductor wafer using a mask formed integrated circuit pattern, and the reduced projection exposure equipment.

The first invention is a reduced projection exposure method of circuit pattern on semiconductor using both a mask cover and a wafer cover. The mask cover contacts to a integrated circuit pattern on a mask. And the wafer cover contacts to a photosensitive resist film on semiconductor wafer. When the mask is illuminated, exposure light is passing through the mask cover, a projection lens, and a wafer cover, and is exposing a photosensitive resist film on semiconductor wafer. After removing a wafer cover, developing a photosensitive resist film, the circuit pattern is formed on a semiconductor wafer.

FIG. 1 shows a block diagram of reduced projection equipment employed in the semiconductor device fabrication. The mask and semiconductor wafer are also shown in FIG. 1. The mask has a mask cover contacted to the circuit pattern and the semiconductor wafer has a wafer cover contacted to the photosensitive resist. There is a narrow gap between the projection lens and wafer cover. A fine pattern whose size is narrower than a exposure wavelength is possible to print by using this exposure method.

At first, we will explain differences between the present invention and Japan Patent Publication No. 3120474.

The method disclosed in Japan Patent Publication No. 3120474 had a problem that a distortion and poor resolution are brought by the thick material of high refractive index between the mask pattern and the projection lens.

It is found that a fine pattern that is narrower than exposure wavelength is poor resolution of printing, because of wavefront aberration caused by a thick mask cover. Japan Patent Publication No. 3120474 does not disclose the effect of wavefront aberration of inserting a thick material of high refractive index between the mask pattern and the projection lens.

In order to solve the distortion problem of printing pattern, this inventor analyzed the wavefront aberration of a specified mask. This mask consists of an opaque pattern substrate and a phase shift pattern substrate. These substrates are overlapped.

This inventor finds that the wavefront aberration of the case which is inserting a mask cover between a mask and a projection lens is reduced much, by adjusting the optical position of a mask, a projection lens, and an image plane. And this inventor finds that the wave front aberration of the projection lens using the mask cover of quartz plate and about 0.3 mm is lower than the case without a wafer cover. This is different from the conventional estimation.

Further, this inventor finds that the resolution of printed circuit pattern can be improved by using a wafer cover, under the same conditions including exposure wavelength, numerical aperture, and aberration of the projection lens. The wafer cover contacts to a photosensitive resist film.

Next, the base of the present invention will be explained by using from FIG. 2 to FIG. 5.

Figure 2:
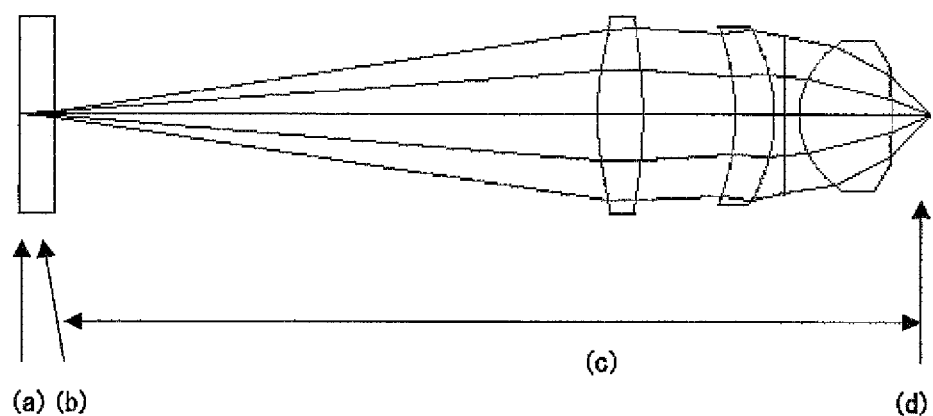
FIG. 2 is a designed reduced projection lens and ray tracing plot, using the mask cover on the circuit pattern mask.

FIG. 2 shows the designed projection lens and the optical beam path as defined by ray trace plots. This is a case in which a mask cover (refractive index:>1) is inserted on surface of a mask. Projection lens that we designed was wavelength $\lambda$=248 nm, NA (numerical aperture)=0.75 for KrF (krypton fluoride) excimer laser.

Material of the mask cover is quartz. The mask cover contacts to the circuit pattern of the mask. And it is possible to change the thickness of the mask cover.

Figure 3:
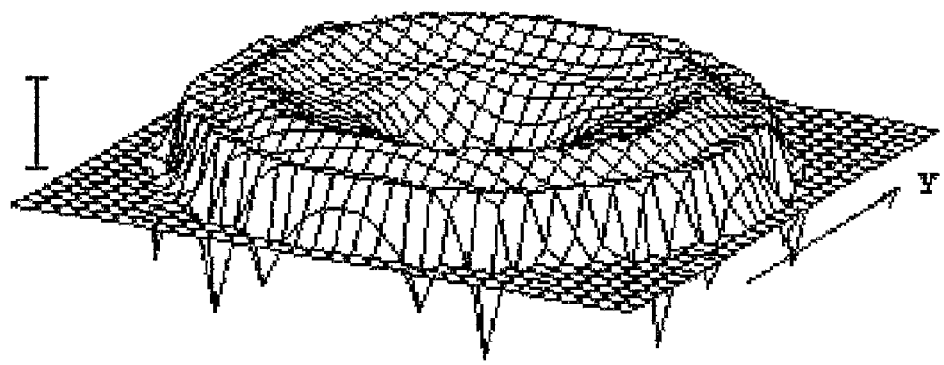
FIG. 3 is a wave front aberration data of a designed reduced projection lens without using the mask cover.

FIG. 3 shows a wavefront aberration of the designed projection lens without a mask cover. This aberration is optical path difference from ideal reference of wavefront at the exit pupil plane of the projection lens. This shows a whole path difference of exit numerical aperture from the point of image plane. For convenience, we use rms value of a wavefront aberration. The rms of the projection lens that we design is $0.0017\lambda$ as shown in FIG. 3. This value is very narrow. This method is a valuable method for evaluation.

When thickness of a mask cover of quartz plate=2.3 mm is used, the wavefront aberration of the projection lens is increased up to rms=$0.3314\lambda$. This value is about 200 times bigger than the case without the mask cover.

This inventor found that projection image cannot form patterns under the condition of the above big wavefront aberration.

However, when the positions of the mask and image plane are adjusted to the optimum positions, the wavefront aberration of the projection lens is reduced to rms=$0.0089\lambda$. This case is using both the same mask cover of material and thickness, and the same projection lens.

This inventor found that the wavefront aberration is reduced much by optimizing the position of the mask and image plane.

Figure 4:
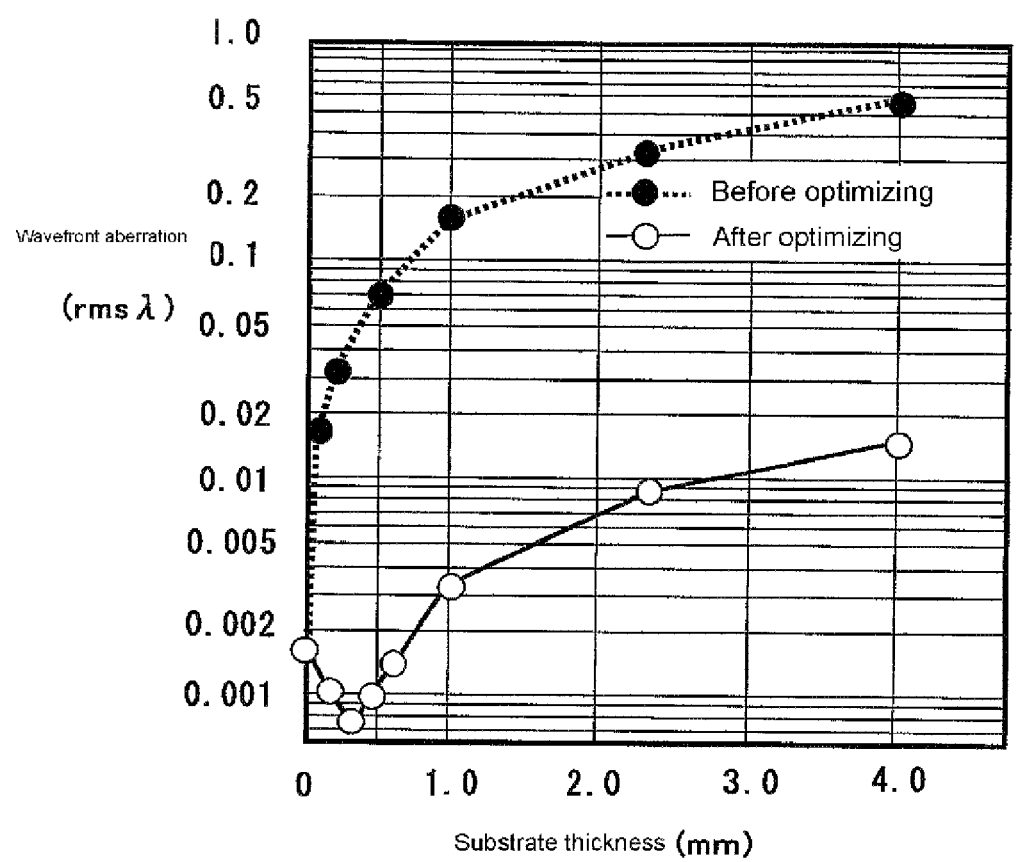
FIG. 4 is an evaluation data of wave front aberration of a reduced projection lens for checking the mask cover thickness.

FIG. 4 shows wavefront aberration data which is wavefront aberration vs. cover substrate thickness. Material of the mask cover is quarts glass (refractive index: 1.47). The wavefront aberration increases depending on cover thickness in the case of inserting a mask cover between the mask and projection lens. The positions of the mask and the image plane were not optimized in this case. As shown FIG. 4, the wavefront aberration is depend on cover thickness for the optimum case of correcting optical position of both the mask plane and the image plane.

In optimum case of correcting optical position of both the mask plane and image plane, the wavefront aberration of a cover thickness is unexpected results. This is because conventional method of the projection lens was treated as a black box. As far as this inventor knows, there is no paper or patent disclosing the above results.

This inventor found that the wavefront aberration of optimum case is narrower than that of a case without a mask cover. This case is using a mask cover (thickness: 0.1 to 0.6 mm) and correcting optical position of both the mask plane and the image plane.

Figure 5:
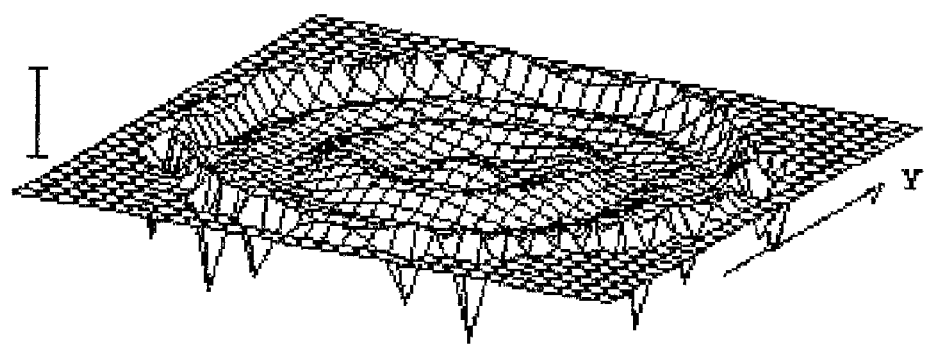
FIG. 5 is wave front aberration of optimum case of a designed reduced projection lens when a specified thickness of the mask cover is used and the mask position and image position is adjusted to optimum position.

The rms value of the wavefront aberration (the mask cover thickness: 0.3 mm) is 0.0008λ, as shown in FIG. 5.

The reduced projection system has a function that one point light emitted from a mask is printing one point on a photosensitive resist film. The projection image optics is 1:1 corresponding, from the mask point to the image point. If exposure light is emitted from the wafer plane, light passes through a minimum path, and printing on the mask plane.

This inventor found that reduced projection exposure using a wafer cover contacted to a photosensitive resist film is effective of increasing resolution of pattern printing instead of the mask cover contacted to the mask pattern.

Most effective case is reduced projection lens, an integrated circuit pattern the mask with the mask cover, and a semiconductor wafer with the wafer cover are used. A fine pattern is possible to expose on a wafer, after optimizing the mask and the wafer position.

This exposure method is different from liquid immersion that fills the room between the projection lens and wafer with liquid. This method does not need to fill the room between the projection lens and wafer with material whose refractive index is bigger than 1. The reduced projection exposure equipment has to change position between the projection lens and the wafer, wherein there is a narrow gap between projection lens and wafer cover.

The invention of this embodiment is improving resolution of printing pattern by using a wafer cover of fixed thickness on the photosensitive resist surface.

As shown FIG. 1, a reduced projection exposure method of the 1st embodiment is explained as follows.

The reduced projection exposure equipment is a Stepper (rate of reduction: 5:1). The mask M1 is a reticle formed circuit pattern of 5 times enlargement. Hereinafter this reticle is written as the mask.

Light source E1 of the reduced projection exposure equipment is monochromatic light of exposure radiation for example, I-line (wavelength: 365 nm), KrF (wavelength: 248 nm), ArF (wavelength: 193 nm), F2 (wavelength: 157 nm). The exposure light is emitted form light source E1. Exposure light illuminates the mask M1, using the mirror E2 and the condenser lens E3. And exposure light exposes a photosensitive resist film on a semiconductor wafer W1, after passing through a mask cover M2, reduced projection lens E7, and a wafer cover W2.

A principal plane of the mask M1 sets the direction of semiconductor wafer W1. The mask cover M2 which is transparent for the exposure light contacts to a principal plane of the mask M1.

The semiconductor wafer W1 is mounted on XYZ stage E8. Photosensitive resist film is formed on the surface of the semiconductor wafer W1. Wafer cover W2 sets the surface of a photosensitive resist film. The higher refractive index is more favorable for the material of a wafer cover.

The wafer cover W2 is made of quartz glass (thickness=1 mm, refractive index=1.47) which is transparent to the exposure light effectively. The gap between a projection lens and a wafer cover sets 100 micron. The thickness of the wafer cover is more than 90% of optical length between the end of projection lens and a photosensitive resist surface.

Resolution of the printing pattern has a big effect by increasing the wafer cover thickness corresponding to the optical length between the end of the projection lens and photosensitive resist plane. It has to detect a gap between the end of projection lens and the wafer cover. After filling the gap with N2 gas, the gap is possible to know by detecting gas pressure. Deviation of the gap space is suppressed by the above gas detection.

Figure 6:
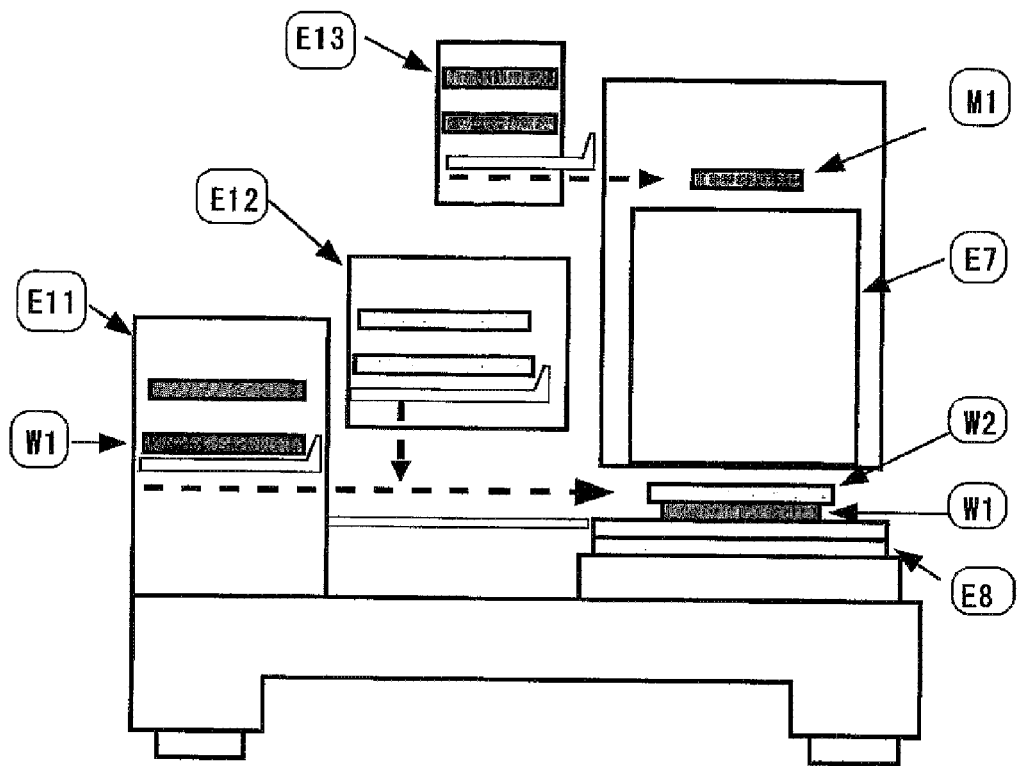
FIG. 6 is an explanatory diagram showing both the mask loader and wafer loader. The mask and wafer are loaded to exposure equipment of FIG. 1 by these loaders.

FIG. 6 is a schematic organization showing a loader of the mask, wafer and wafer cover set in the system of FIG. 1. The mask cover attaches to a mask. Then the mask loader is presented at one point. Usually, exposure process has to print on semiconductor wafers, but for one wafer.

A semiconductor wafer and a wafer cover have set to load separately, in order to prevent a case that particles on a wafer cover are printing onto the other wafers.

If one wafer cover is used to several wafers, printing error will occur, after the particles attached on one wafer is attaching to other wafers.

A wafer cover contacts to one wafer. A wafer cover is possible to set to load and unload independently cleaning after one exposure process.

The semiconductor wafer and a wafer cover are moved on the exposure stage together by the independent loader and the career arm. The size of wafer cover is bigger than that of the semiconductor wafer. A wafer cover locates on an exposure stage together with a wafer by vacuum chucking from the opposite side of projection lens, after contacting to the wafer.

A wafer cover is possible to be held with a wafer as one body. Instead of vacuum chuck, the wafer cover is chucked by water on the photosensitive resist film.

An idea that particle attached on photosensitive resist over semiconductor wafer prevents from exposing to other wafer is necessary for liquid immersion exposure. Exposure equipment of the present invention has means of exposure as an immersion exposure equipment using water.

It is found that the projection lens surface of an immersion exposure equipment is exposed with particles by contacting projection lens with transparent liquid. And a cleaning means of particles attached to the projection lens may be a factor of micro bubbles in transparent liquid during immersion exposure.

In order to solve the above problem, this immersion exposure equipment has means of a lens cover of the image sides of the projection lens. This lens cover is made of quartz glass that is the same as projection lens. It is easy to change this lens cover.

Figure 7:
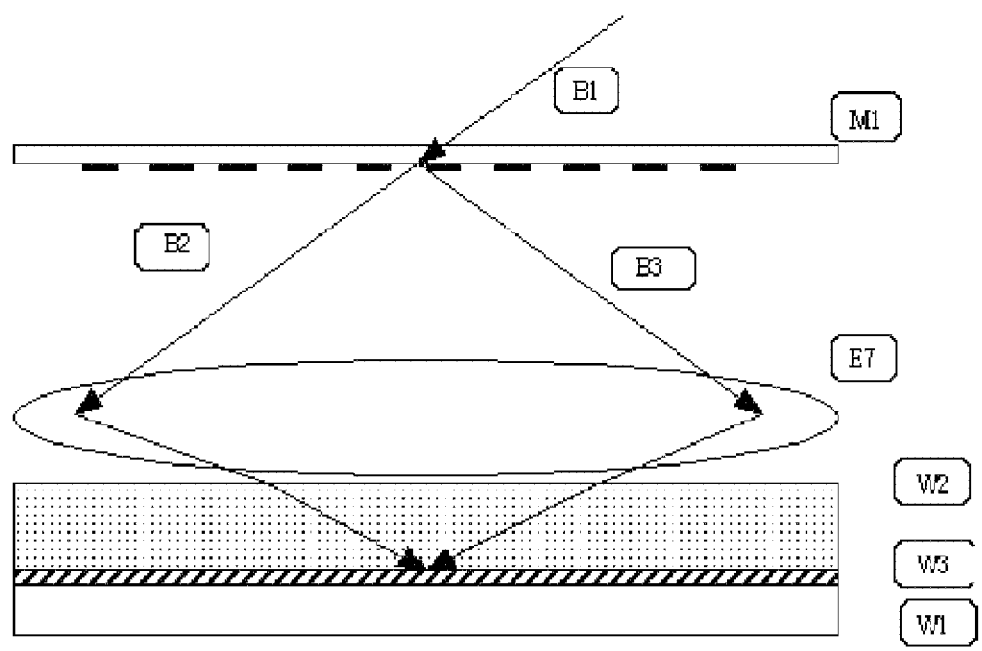
FIG. 7 is an explanatory diagram showing an exposure method of both an off-axis illumination and a wafer cover.

Next, this exposure equipment has means of reduced projection exposure both a off-axis illumination and a wafer cover contacted to a photosensitive resist film over the semiconductor wafer. Off-axis illumination sets means of exposure light angle corresponding to both the orientation and pitch of circuit pattern of the mask. As shown in FIG. 7, a divided exposure light flux illuminates the circuit pattern of the mask, and exposes a photosensitive resist film after passing through a projection lens and a wafer cover.

Means of off-axis illumination changes an illumination angle corresponding to the orientation and pitches of the circuit patterns of the mask.

This is performed by inserting a specified aperture on the mask illumination that has 2 or 4 apertures and changing positions of these apertures from optical axis center. The direction of (0, +1, −1 order diffraction light) off-axis illumination according to the mask pattern changes.

As shown in FIG. 7, divided exposure light is imaged on the wafer by using both diffracted light of 0 order and diffracted light of +1 order. It is also imaged on the wafer by using both diffracted light of 0 order and diffracted light of −1 order. This exposure method is effective for the case that circuit pattern of the mask is arranged uniformly in x direction or y direction.

A fine pattern that is narrower than exposure wavelength is able to print by means of off-axis illumination of exposure light to the circuit pattern the mask and means of shortening exposure wavelength using the wafer cover.

Means of shielding illumination light of center part of the mask resolution of 45 degree of circuit pattern improves.

Resolution of printing pattern is possible to be improved by both means of the mask illumination and means of focusing through a wafer cover. Angle to the mask illumination corresponds to the mask circuit pattern.

The reduced projection exposure equipment of the 1st embodiment has means of measuring the thickness of the wafer cover. The measurement means detects a reflected light position by illuminating laser light of slope angle to the surface of a wafer cover and a photosensitive resist film.

It can be substituted by detecting refracted light positions at the fixed part of the exposure equipment corresponding to the surface of a photosensitive resist film.

Figure 8:
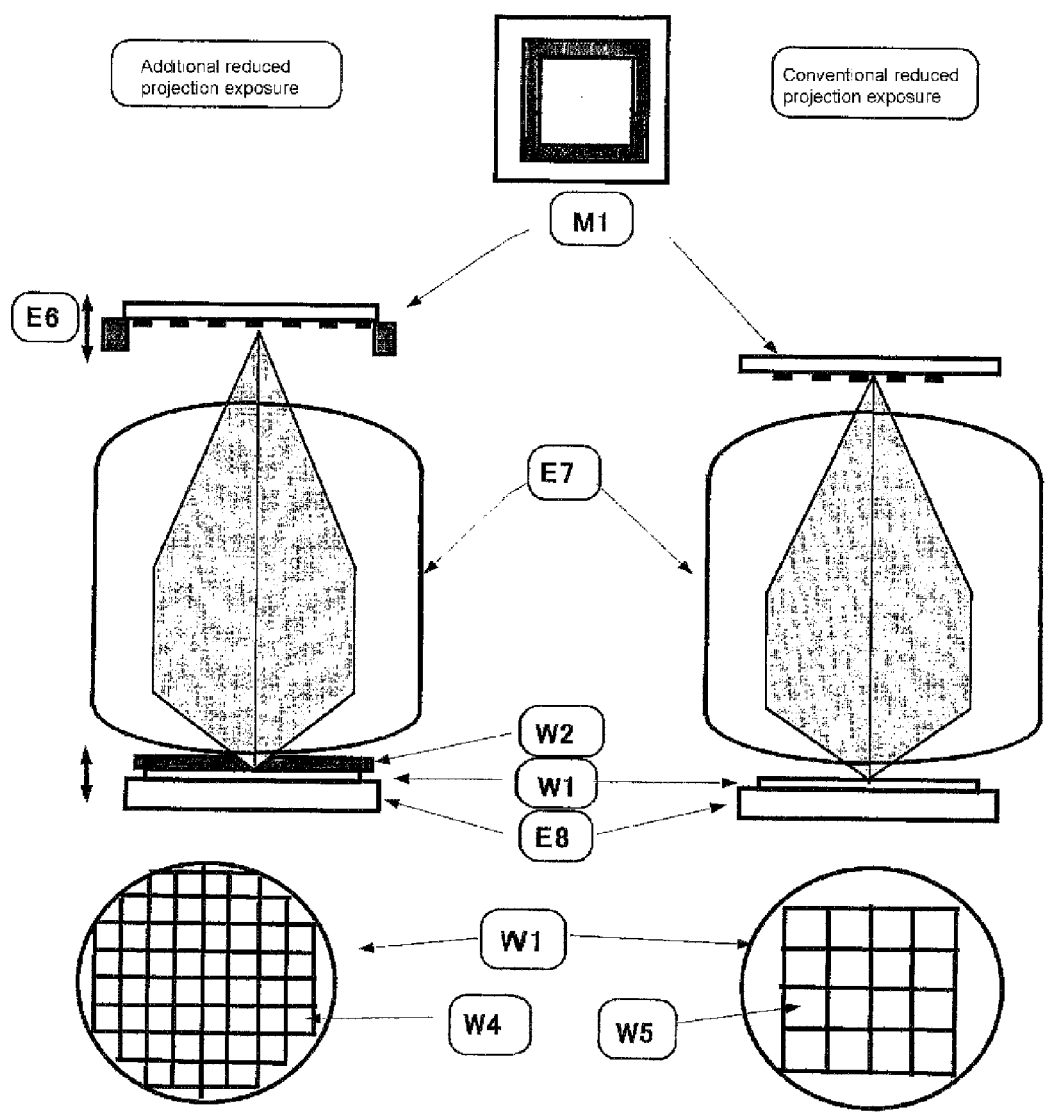
FIG. 8 is an explanatory diagram showing an exposure method of both an additional reduced projection exposure and a wafer cover.

As shown in FIG. 8, the exposure means that integrated circuit pattern of the mask printing the photosensitive resist of the wafer is possible to perform additional reduction with about 0.5 times to a fixed scale.

It is possible to change of reduction rate by adjusting optical positions of a mask and a wafer. It is also possible to adjust a position of correction lens of the projection lens. Additional reduction of circuit pattern of whole integrated circuit chip is possible to print by using both means of additional reduction and means of a wafer cover exposure.

The exposure equipment of this invention has means of reduced projection exposure both with a wafer cover and without a wafer cover.

The above means adjusts and optimizes optical axis position of the mask and wafer. The above means can adjust optical axis position of one lens of the projection lens. The above means can add another lens to the projection lens.

A fine pattern is a high accuracy printed pattern on a semiconductor wafer that pattern size is narrower than exposure wavelength. For example, this pattern is gate pattern and wire pattern on the semiconductor device and can be form by reduced projection exposure method using a wafer cover.

A rough pattern is not high accuracy compared with a fine pattern. A rough pattern on a semiconductor wafer is bigger than exposure wavelength. For example, these patterns are source pattern and drain pattern of MOS device, and active area pattern of the semiconductor device and can be formed by conventional reduced projection exposure method without a wafer cover.

Figure 9:
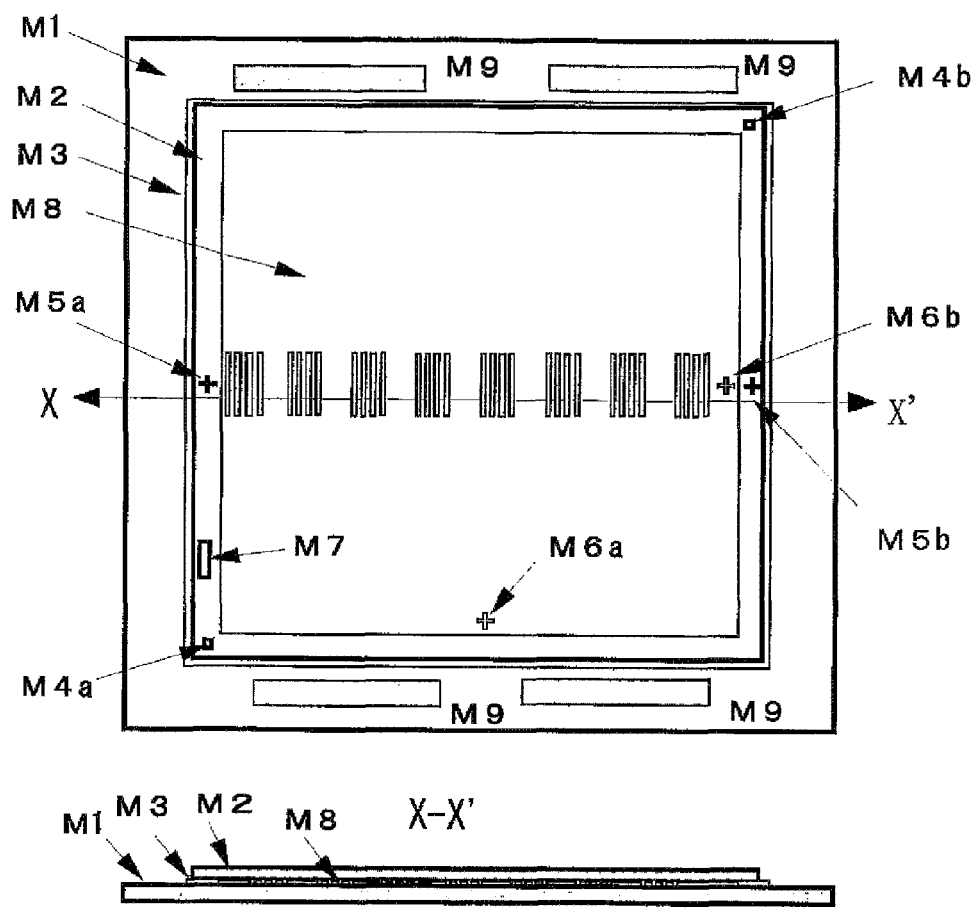
FIG. 9 is a plane view and a cross-sectional view showing a mask and a mask cover.

Next, the mask of the 1st embodiment will be described as follows. FIG. 9 is a plane view and a cross sectional view of the mask of the 1st embodiment.

As shown in FIG. 9, a glass substrate of the mask cover M2 is overlapped with the pattern sides of the mask M1.

A mask M1 consists of a quartz glass plate which is transparent for the exposure light. This mask has a first principal plane and a second plane of reverse sides. The first principal plane contains transmission area M8 surrounded by opaque area M3. Opaque film which is shut off exposure light is made of metal film of Cr.

The mask cover M2, projection lens E7 and wafer cover W2 are on the exposure light path between the mask M1 and the wafer W1, and these optical path differences are affecting to printing of the mask pattern.

As shown in FIG. 9, patterns (M4a, M4b) of magnification correction and pattern M7 of focus correction are formed on peripheral area of transmission pattern area. Pattern M7 for focus correction is lines and space patterns. The photo sensor E9 sets on the optical position corresponding to the wafer surface. Focus position is fixed by optimum position of pattern contrast imaged on a photo sensor E9.

By passing through correction pattern on the mask, the wafer cover is detected. The correction pattern are composed of patterns (M4a, M4b) of magnify correction and pattern M7 of focus correction.

Positions of magnification correction patterns (M4a, M4b) are measured by using laser interferometer of wafer stage by detecting optical signal corresponding to the patterns (M4a, M4b).

By measuring the positions of patterns (M4a, M4b), magnification correction is performed, so as to move the expected position of the stage, by moving the position of the mask and image plane. This magnification correction is possible by moving a part of projection lens instead of the mask plane and image plane.

Magnification error and focus error are corrected by means of micro movement mechanism of a mask, a wafer, and one correction lens of projection lens. The deviation of a wafer cover thickness is measured by exposure light passing though.

Exposure light is possible to print on a photosensitive resist film over the wafer, after passing though a mask cover and a wafer cover. Printing pattern of the mask M1 is formed, after removing a wafer cover W2 and developing photosensitive resist film.

There is a masking blade E4 on exposure light path between condenser lens E3 and the mask M1 of the reduced projection exposure equipment. A masking blade E4 is a blocking mechanism of outer part of exposure area of the mask M1.

There is an alignment mechanism E5 on exposure light pass form light source E1, the mask M1 to the semiconductor wafer W1. An alignment mechanism E5 optically detects alignment information between the mask M1, exposure equipment, and semiconductor wafer W1.

These patterns are not printed on a wafer by shutting off the exposure light using a masking blade E4.

Next, the positioning accuracy of between the circuit pattern of the mask and that of the wafer was got by detecting and overlapping both a chip alignment mark M6 and a alignment mark formed on the wafer.

Alignment mark pattern M5 of FIG. 9 is used for overlapping between the mask M1, exposure equipment and semiconductor wafer. This mark is formed on the opaque area M3 on the mask M1 by removing opaque film. Alignment mark pattern M6 of FIG. 9 is used for overlapping between a transmission area M8 and a under layer formed on the semiconductor wafer W1.

And another alignment mark pattern for the demanded process is formed inside of the transmission area M8 in order to overlapping a circuit pattern for next photo lithography process. The reason is that alignment base of many layer pattern of a semiconductor integrated circuit are not overlapped under layer pattern serially and are overlapped with a fixed layer pattern.

The pattern information area M9 is arranged on the peripheral area of the opaque region on the principal plane of the mask M1. This pattern information area M9 contains information pattern such semiconductor device name, exposure process name, and division number.

This information pattern is formed on Cr opaque film. This information pattern is possible human readable format of ASCII character, or mechanical readable format such as barcode.

Figure 10:
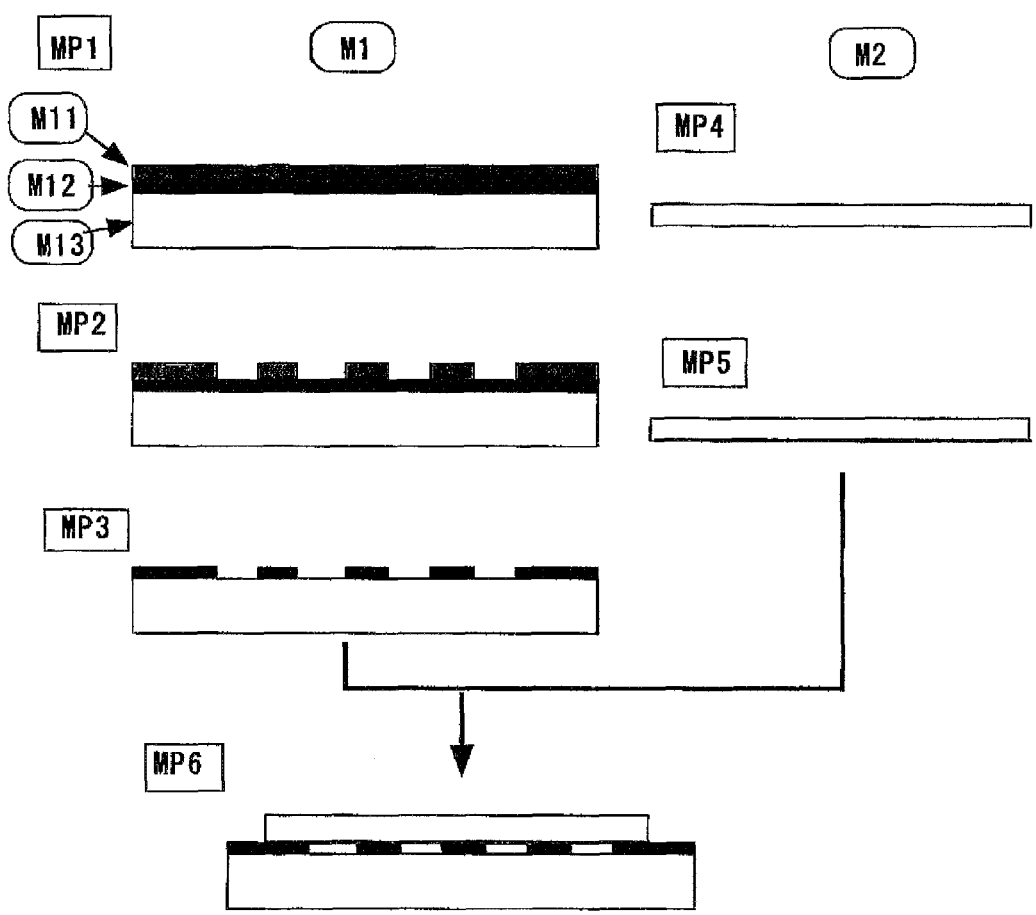
FIG. 10 is an explanatory diagram showing a mask process flow of manufacture using a mask cover.

Next, a fabrication method of a mask M1 of the 1st embodiment will be explained. FIG. 10 is an explanatory cross sectional view of a mask process flow of the 1st embodiment.

MP1 is the process of courting electron beam resist on the main surface of the mask M1, after depositing an opaque film of Cr by spattering method.

MP2 is the process of forming a resist pattern of integrated circuit by exposing electron beam on the mask M1 selectivity and developing resist.

Next, MP3 is the process of forming circuit pattern on the main surface of the mask M1 by etching the opaque film. Alignment mark, opaque area, and other are also formed.

After forming a circuit pattern on the mask M1, the pattern of the mask M1 is inspected by using a inspection tool. This inspection is comparing a circuit pattern of different position on the same mask or comparing a circuit pattern of the mask design data.

MP4 is the process of preparing the mask cover. It isn't illustrated specially. It is possible that phase shift pattern is formed on the mask cover.

MP5 is the process of cleaning, and the process of forming an anti-diffraction film.

MP6 is the process of fixing the mask M1 with outer potion of a mask cover M2 using adhesive after inspection.

The mask cover is a substitution of particle shield which is called pellicle. It is possible to remove particles attached on the mask cover by blowing clean air. Particle size printed on wafer depends on the distance between the mask pattern and the mask cover. It is easy to remove particle by blow, because of physically strong comparing with pellicle.

The opaque film of the mask is chrome film, and is possible to use a half tone film of the phase shift mask. Phase of transmissive light between half tone film and opening area is inversed together.

The half tone mask has to form opaque film on peripheral portion of transmission area M8. An opaque film of a mask with a mask cover can uses organic film instead of metal film shielding exposure light.

The alternate phase shift mask inverted phase of adjacent pattern can be used instead of the half tone the mask. Another type of phase shift mask for deductive interference of transmission light is possible to use. A fine pattern that pattern size is narrower than the exposure wavelength can be formed on the semiconductor wafer by both a phase shift mask and a wafer cover.

OPC (optical proximity correction) pattern correcting printing distortion is possible to arrange transmission area M8 of the mask. Distortion of projection exposure with a wafer cover is narrower than that of conventional exposure method. This invention is possible to use simple procedure of OPC to shorten a time of both the mask data transformation and the mask exposure, and has a merit of reducing fabrication cost of a mask having OPC pattern for the top level device.

The 2nd Embodiment

The 2nd embodiment will explain forming process of the mask and data for exposure process of the 1st embodiment, in order to fabricate a semiconductor integrated circuit.

Most efficient method of developing a new semiconductor process technology uses a conventional mask. This mask formed a fine circuit pattern which is near the resolution limit by using a conventional reduced exposure method.

As shown in FIG. 8, additional reduction is effective by new exposure equipment using a wafer cover, if this additional reduction is narrower than a fixed scale by a combination of conventional reduced projection exposure equipment and the mask.

The resolution using both a projection lens of conventional exposure equipment and an additional reduction of a mask does not increase. This invention is effective for large numerical aperture of a projection lens. This method is most effective for reducing a mask cost in order to develop a semiconductor fabrication process for a new semiconductor device. The conventional exposure equipment is exposure wavelength: 193 nm or 248 nm and numerical aperture: <1.

The exposure equipment of this invention has means of varied reduction printing. As shown in FIG. 8, varied reduction of the exposure equipment moves a mask and wafer on optical path direction. The exposure equipment can also move a part of projection lens. The above method can reduce to 0.5 times.

The design of the projection lens has to minimize aberration. Additional reduction of 0.5 times for the liquid immersion exposure equipment is also possible for using a conventional the mask.

The means of additional reduction of exposure equipment is effective to a new the mask. The accuracy of this the mask needed for developing a new semiconductor device is loose.

In a step of developing new semiconductor devices, the mask technology is not fit to device technology. This new mask has to be fabricated using a conventional mask technology. After developing the mask technology, a mask for mass production is possible to fabricating with high accuracy.

Figure 11:
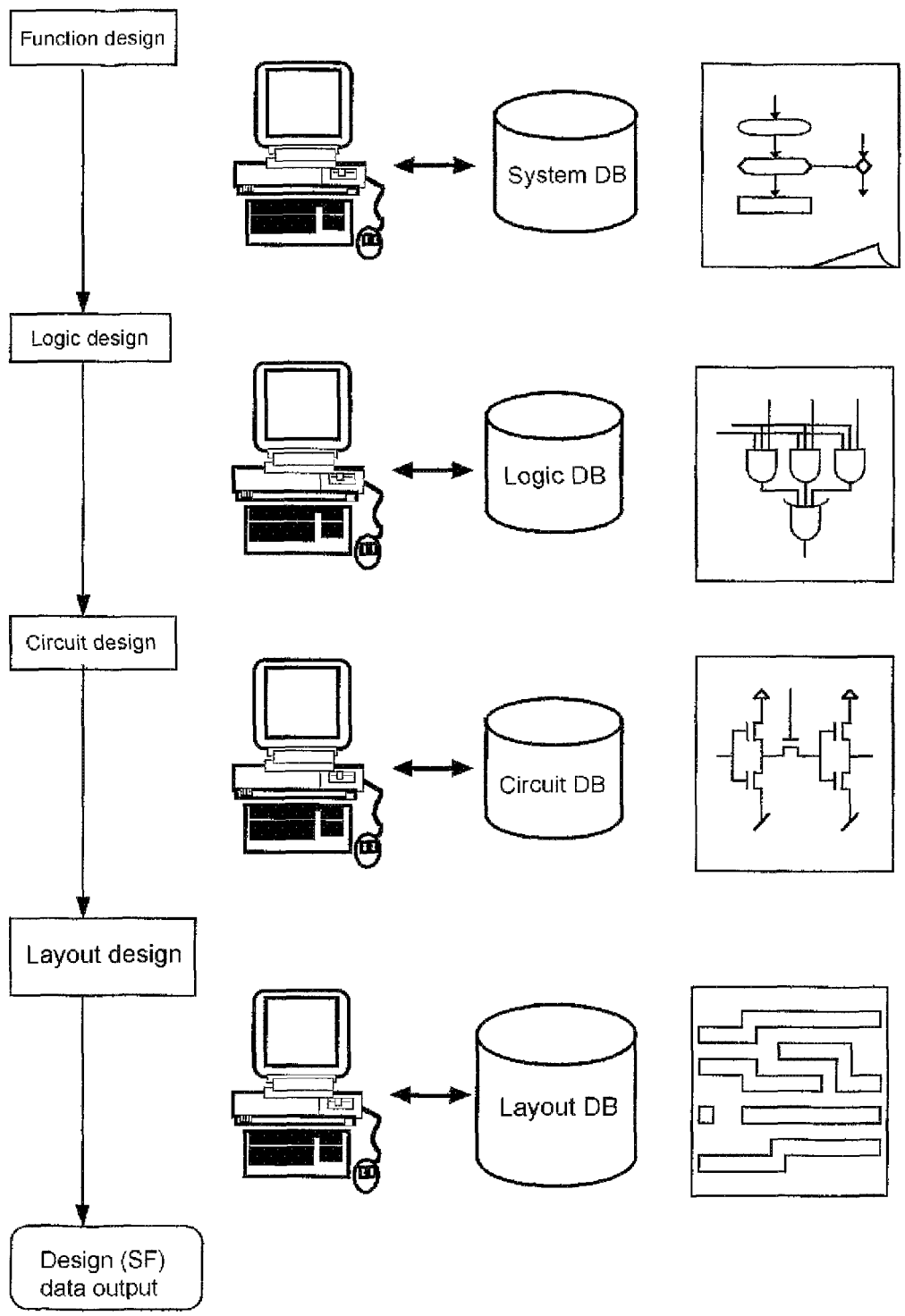
FIG. 11 is a schematic diagram showing a design process of integrated circuit.

Referring to FIG. 11, a flow from design process of integrated circuit to the mask design process of the mask fabrication of the embodiments 2 will be described in detail hereinafter.

FIG. 11 is an example of the mask data formation flow. The mask data of integrated circuit is formed in several steps of function system design, logic design, circuit design, and layout design.

Function system design is a process of fixing a basic specification needed for design, fabrication, and inspection. This step is a process of drawing a basic specification of a semiconductor device and designing its operation of functional register number, bit number, and architecture in detail.

Next, logic design is a process of performing logic simulation and presenting logic gates. In this step, unit of logic gates is presented according to system design data. Logic error is corrected by simulation check.

Next, circuit design is a process of presenting circuit elements by circuit simulation. This step is a process of designing an electric circuit element and transistor. Then, basic circuit, circuit cell, and whole circuit are designed.

Next, layout design is a process of circuit pattern layout by both a wiring pattern check for connecting of device elements and a layout rule check. This step is layout and wiring of logic gates, generating a pattern data of the mask design. The mask design data is formed by the above process.

This mask design data checks layout pattern and wiring of logic gates, by using CAD (computer aided design) system. Then, as standard format of integrated circuit pattern, this mask design data is outputted SF (stream format) format data.

SF data of the mask design data is performed several process such as a removing overlapped pattern, a dividing basic format, a dividing diffraction field, and the mask pattern CD correction. The conversion conditions of the mask data are depended on the mask drawing equipment.

At present, the mask drawing data is a specified format for an individual equipment of the mask equipment maker and has to be converted to the mask drawing equipment. For example, MEBES is a mask drawing equipment of US ETEC Ltd. This equipment is adopting a drawing method called 'RASTER'. The circuit pattern on the mask is drawing by repeating a on and off exposure of electron beam spot. Beam size is address size of the mask design data.

And for example, Hitachi Ltd. HL-800 adopts a drawing method called 'VECTOR'. A drawing of a circuit pattern on the mask is performed by using a variable size of electron beam corresponding to address size of the mask design data.

The mask drawing data is transformed to the data format corresponding to both the drawing method and the drawing equipment. Basic format division, diffraction field division, the mask pattern correction, or the like is performed in this data conversion. The mask pattern correction is contained both correction of forming the mask pattern and correction of exposing a wafer.

After the above transformation of the mask drawing data, circuit pattern is able to form by drawing pattern on a mask plate. A mask composed of circuit pattern, circuit test pattern, the mask test pattern, and alignment mark pattern is fabricated by arranging the mask draw data on a mask.

The most effective circuit pattern of an exposure method of the 1st embodiment is to use a circuit pattern whose main part is exposed by a specified exposure equipment. This equipment has a specification that exposure wavelength 193 nm or 157 nm, and numerical aperture of the projection lens >1. A fine pattern is possible to print by using both the mask and a exposure equipment of the 1st embodiment.

The above the mask is contained a circuit pattern to print on a fine pattern which is narrower than exposure wavelength. By the above method, OPC pattern correcting a distortion of projection exposure is possible to decrease compared with a conventional the mask.

A long time is required for the mask design of developing a new circuit device of very large integration. The mask used for a wafer cover exposure method of the 1st embodiment needs efficiency for high integration.

When a new mask is fabricated, it is efficient to use a circuit pattern of conventional integrated circuit chip, and to use a circuit pattern transformed by computer operation. Resource of conventional circuit pattern is used instead of designing the first stage as shown in FIG. 11.

This mask is formed by using both a reduction of conventional circuit pattern and a new circuit pattern. A mask of a wafer cover exposure is supplied from the mask maker.

A new mask is formed easily by using integrated circuit pattern transformed with transformation rules from a circuit chip pattern of conventional exposure equipment. This method by data transformation rules is reduce time of circuit design. Main part of the mask circuit pattern formed by data transformation rules is possible to fabricate within a fixed time depending on its mask quality.

A main specification of the conventional exposure equipment is numerical aperture of the projection lens and the value is less than 1. By using the exposure equipment and a mask formed circuit pattern, the mask data of the circuit pattern is utilized. The circuit pattern does not substantially contain a pattern formed by the present invention using a wafer cover on a photosensitive resist of refractive index >1.

Figure 12:
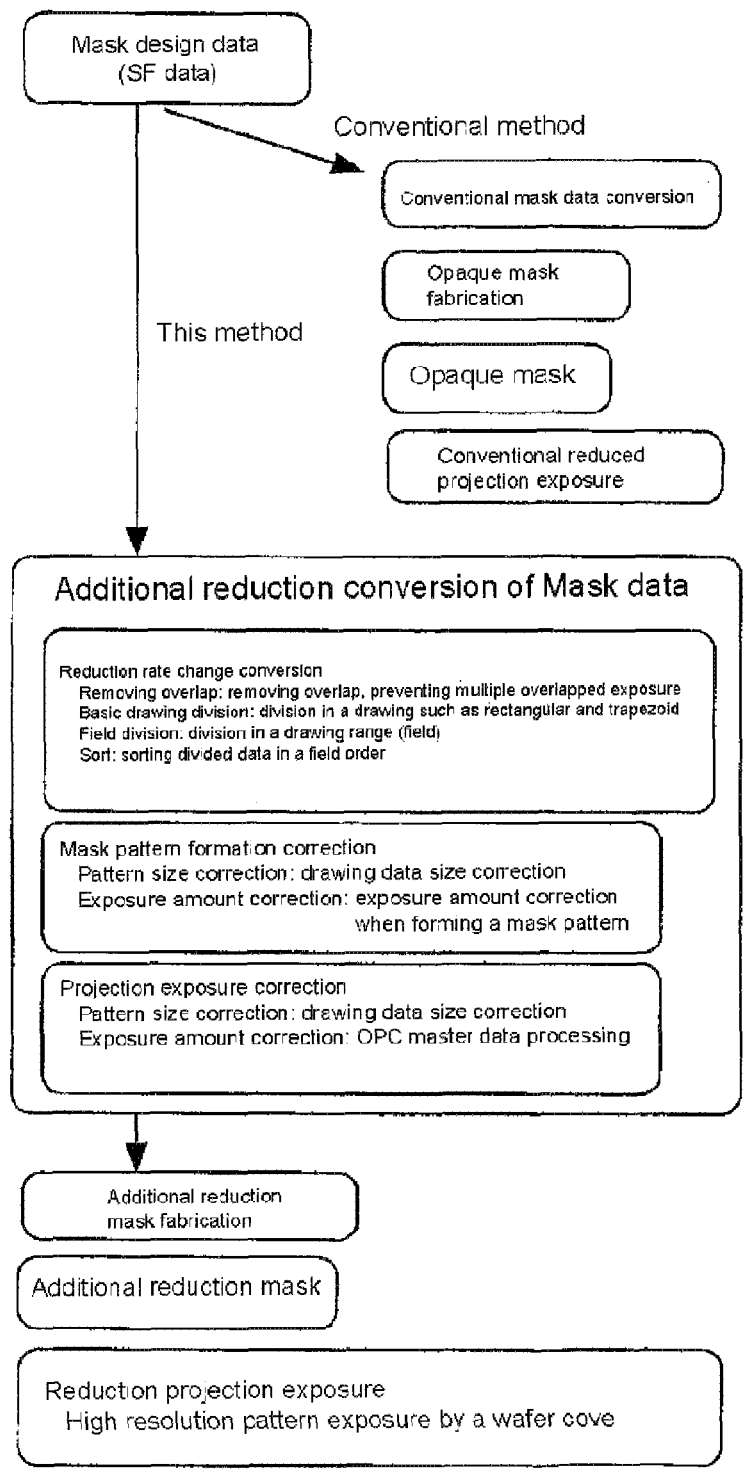
FIG. 12 is an explanatory diagram showing design rule transformation of conventional integrated circuits data, and exposure method using wafer cover.

As shown in FIG. 12, data conversion rules are reduction of integrated circuit pattern and pattern width correction on a fixed area. This data conversion contains a pattern CD correction of the mask fabrication, a pattern correction on the wafer.

Procedure of data conversion by computer needs rules of computer program. Automatic data transformation reduces much time of integrated circuit pattern formation.

It is effective to use a circuit pattern of main part formation by data conversion rule of about 0.5 times reduction of substantially similar shape of circuit pattern. The circuit pattern is used to form a mask and print on a wafer.

Circuit pattern formed on the semiconductor wafer by reduced projection exposure is possible to estimate by light intensity distribution on photosensitive resist. It is usually by using a computing results of exposure wavelength, aberration, numerical aperture of the projection lens. An established technique is Fourier transform of the mask pattern. Circuit pattern on wafer can be computed. By this technique, a mask of aimed circuit pattern is possible to prepare.

Figure 13:
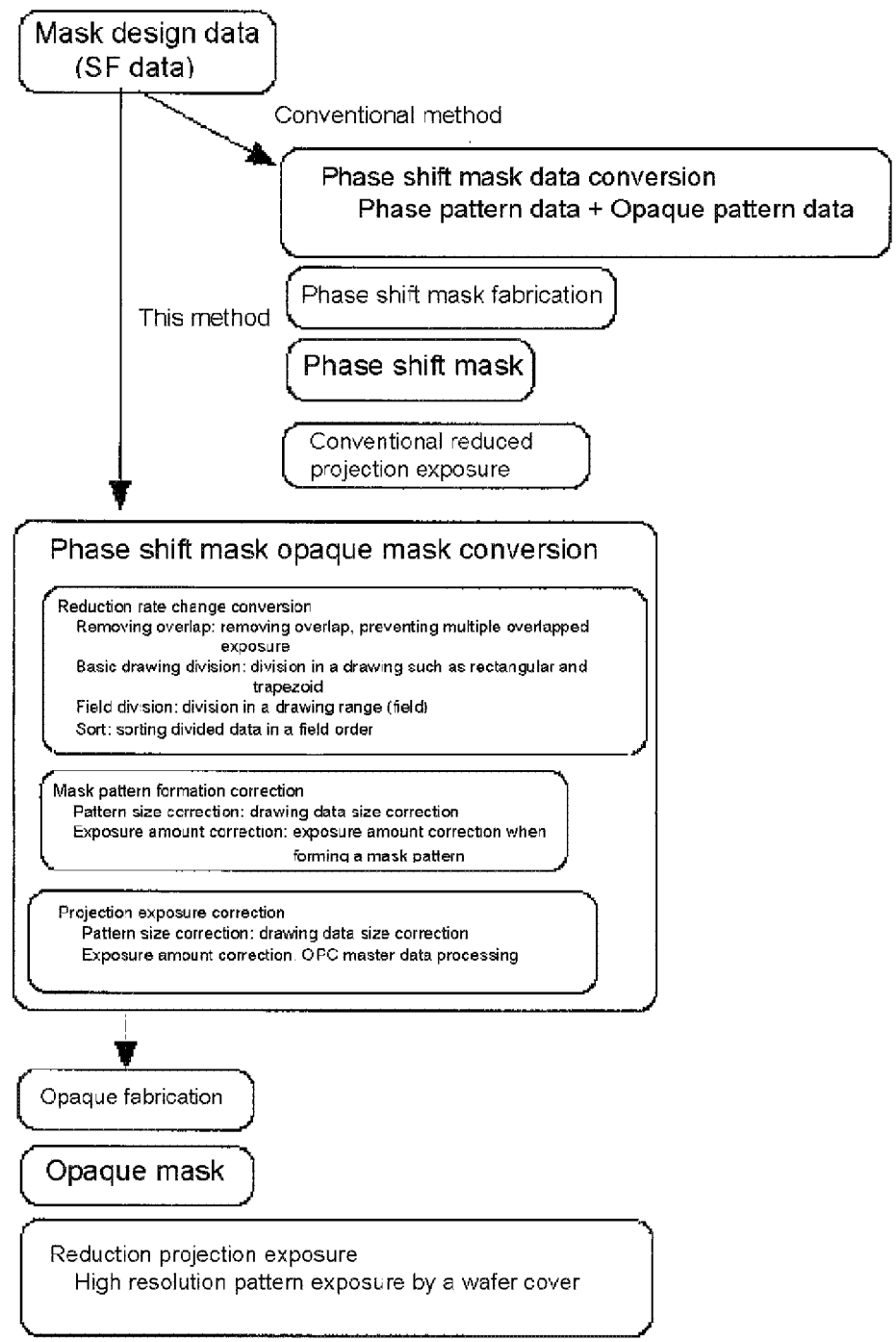
FIG. 13 is an explanatory diagram showing both an exposure method using a wafer cover and conventional method.

The phase shift mask for high level semiconductor devices is required more higher cost and man hour of about 3 times than the conventional opaque mask. As shown in FIG. 13, a part of circuit pattern formed by both a phase shift mask and conventional exposure equipment is possible to form by both an opaque mask and exposure with a wafer cover. This technique can be used for many circuit pattern formed by both a phase shift mask and conventional exposure method. The conventional exposure equipment is numerical aperture of projection lens <1. Circuit pattern is printed by using both a phase shift mask and the conventional exposure equipment, and the mask data of the circuit pattern is possible to prepare.

Circuit pattern of integrated circuit is usually 20 layers and more. A phase shift mask is used for a fine circuit pattern with fine and high accuracy. Circuit pattern of a phase shift mask is a phase shift pattern data and an opaque pattern data. As an opaque pattern data is different from phase shift pattern, an opaque pattern data can be computed without using a phase shift pattern by a computer program. Circuit pattern is formed using a circuit pattern data by computer program operation.

Circuit pattern is formed on a semiconductor wafer by both a mask and exposure method of the 1st embodiment.

A wafer cover is set to contact with a photosensitive resist film over a semiconductor wafer. Exposure light is focusing on a photosensitive resist film over the wafer, after passing through a mask, a projection lens, and a wafer cover.

Circuit pattern of resist film is formed on the semiconductor, after removing a wafer cover and developing a photosensitive resist. Consequently, this method can satisfactorily print an integrated circuit pattern onto a wafer.

The procedure of integrated circuit data of the 2nd embodiment is possible to use for liquid immersion exposure method. In order to use an additional reduction of the conventional integrated mask, a liquid immersion exposure equipment has to provide means of additional reduction projection.

The 3rd Embodiment

The 3rd embodiment is explained CMOS (complementary metal oxide semiconductor) fabrication process for example, by using both the mask exposure method of the 1st embodiment and the mask data formation process of the 2nd embodiment.

The circuit pattern on a mask is possible to print on a semiconductor wafer with fine accuracy by the exposure method of the 1st embodiment is used for fabrication of the semiconductor devices.

A wafer cover contacts to a photosensitive resist film over a wafer. The resist film is formed, after planarizing the surface of the wafer. The exposure method with a wafer cover is possible to print circuit pattern on the mask onto the semiconductor wafer by forming a resist film on a planarizing wafer.

Figure 14:
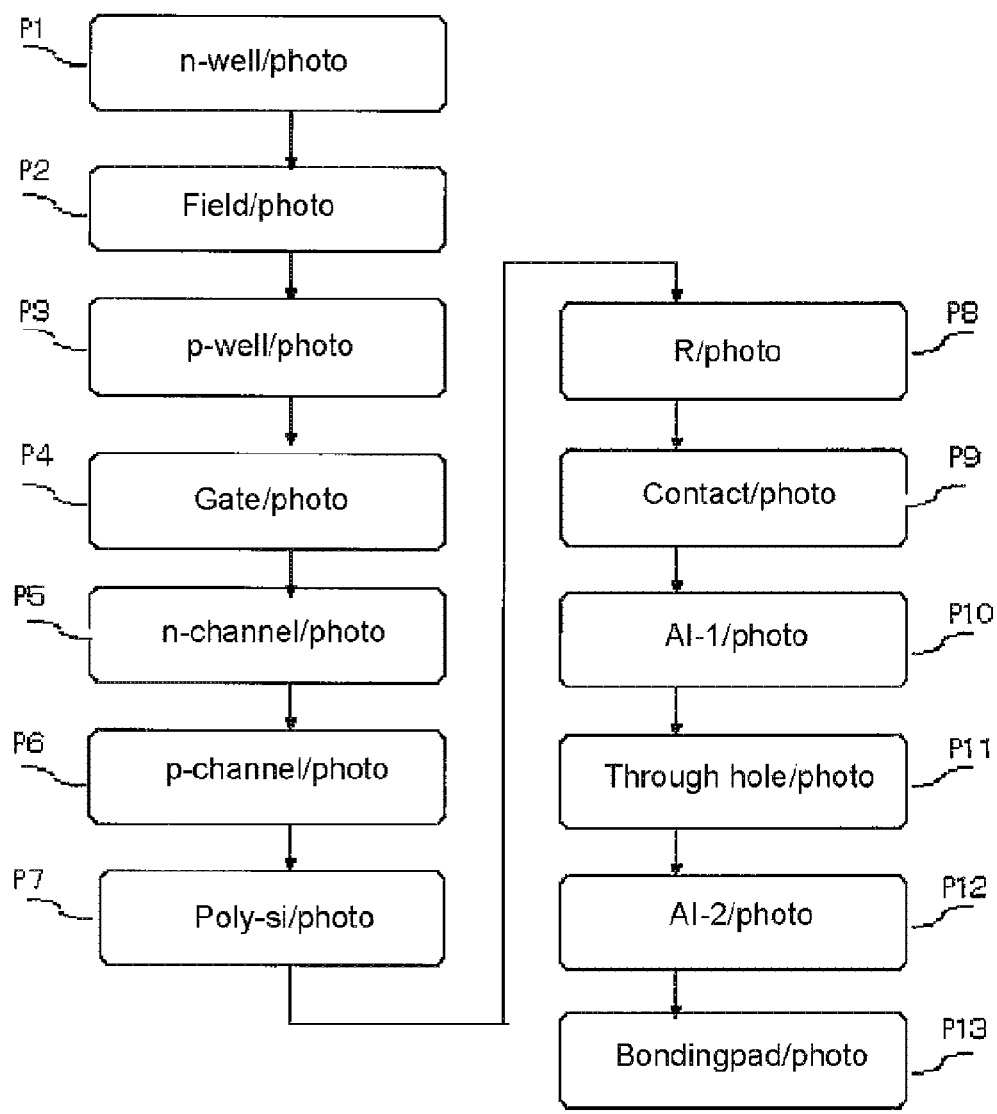
FIG. 14 is a photo-lithography flowchart of the semiconductor device fabrication.

FIG. 14 is a flow chart showing a process for photolithography in the semiconductor fabricating process, i.e., an exposure process in the flow form.

In the same Figure, an n well/photo step P1 is a step of depositing an insulator film such as a silicon nitride film on a semiconductor substrate made of, for example, an n-type silicon mono-crystal constituting a wafer, and then forming a photosensitive resist pattern for covering regions other than n-well forming regions on the insulator film. For example, phosphorous (P) or arsenic (As) is introduced into n wells of the wafer.

A field/photo step P2 is a step of depositing an insulator film such as a silicon nitride film on the principal plane of the wafer, and then forming a photosensitive resist pattern for covering only element-forming regions on the insulator film. A field insulator film made of, for example, silicon oxide is formed on the principal plane of the wafer 12 by local oxidization of silicon (LOCOS), and subsequently a gate insulator film made of, for example, silicon oxide is formed, by thermal oxidization, in the element-forming regions surrounded by the field insulator film. This pattern is rough scale.

A field photo step P3 is one for covering and patterning a photosensitive resist film so that the insulator film such SiN may be patterned to cover the element active regions.

A gate/photo step P4 is a step of depositing an electro-conductive film made of poly-silicon or the like on the principal plane of the wafer, and then forming a photosensitive resist pattern for covering a gate electrode forming region on the electro-conductive film.

A gate forming film made of low-resistance poly-silicon is deposited by CVD or the like, and then the film is patterned by photolithographic technique and etching technique, to form gate electrodes.

Conventional technology for a fine gate pattern is usually formed by a exposure method of using both a half tone phase shift mask and negative type photosensitive resist, or by another exposure method of using both alternate phase shift mask and positive type photosensitive resist. Alternate phase shift mask is inverting the phase of light passed through adjacent openings altogether. This case is used with a trim mask which is shielding the area of phase inverting edge. The exposure method using a wafer cover is possible to select technologies for the above gate/photo step P4.

Figure 15:
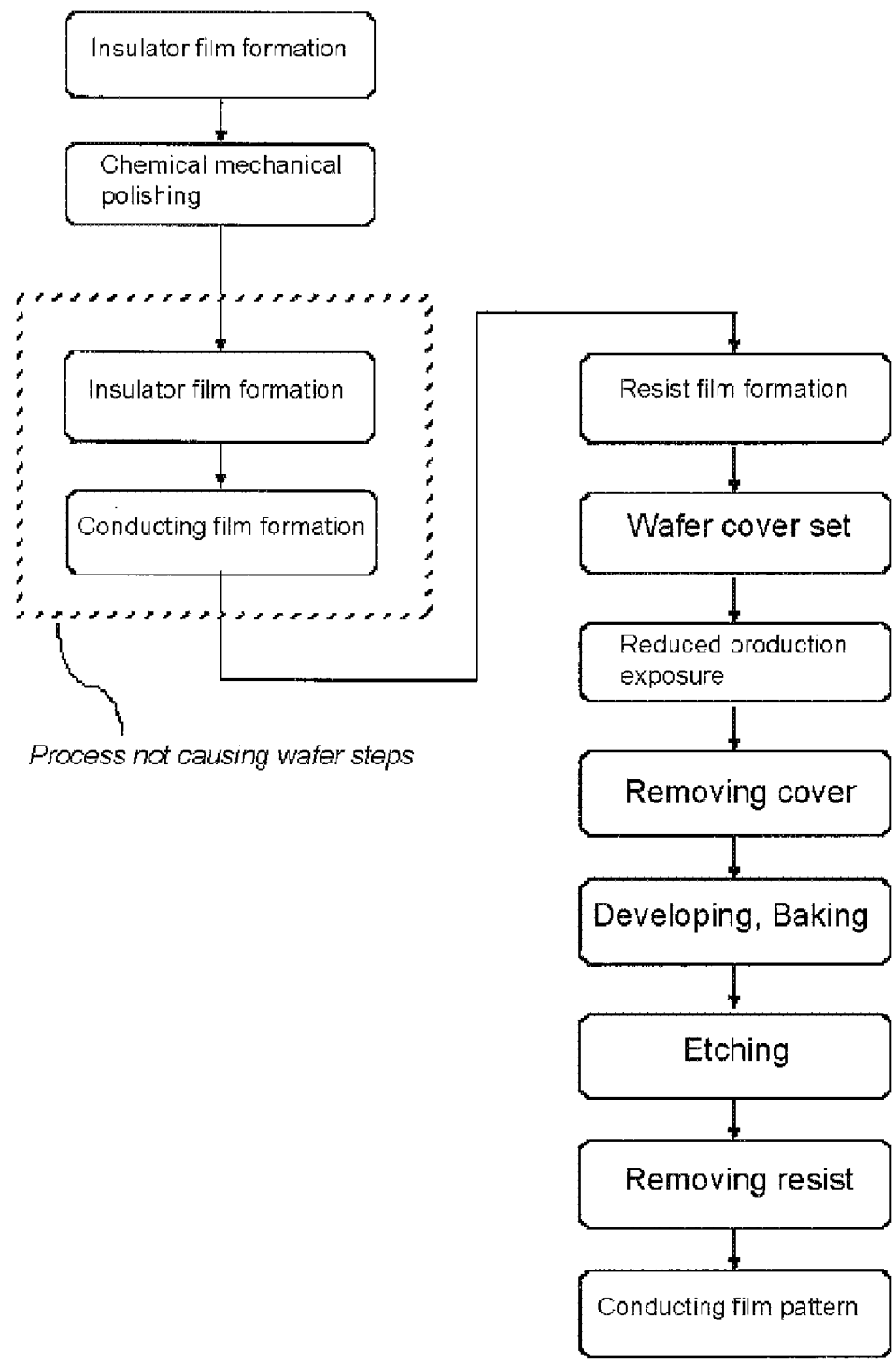
FIG. 15 is a flowchart of gate pattern formation of the semiconductor device.

FIG. 15 shows a process flow of a fine gate pattern of the top-level semiconductor device. This case needs accuracy and minimization of gate pattern. Conductor film for forming a gate pattern needs planarizing. Then, an insulator film layer and a conductor film layer are formed. After that, exposure process of a gate pattern is performed using a wafer cover. Accuracy of transferring gate pattern onto conductor film is possible to increase by the above process.

The planarizing process is CMP (chemical mechanical polishing) process of an insulator film that the surface becomes rough for example by forming an isolation pattern of semiconductor elements on the main surface of semiconductor wafer M1. After planarizing and forming a gate insulator film consisted SiO2 (silicon de-oxide), a conductor film of poly-silicon is formed. Then, a photosensitive resist is formed on the wafer. The surface of the wafer is planarizing. Next, a gate circuit pattern is printed by a reduced projection exposure with a wafer cover.

A gate pattern formed by both a half tone phase shift mask and conventional exposure can be formed by both an opaque mask and a new exposure with a wafer cover.

A fabrication cost of the semiconductor device can be reduced, by using this exposure method. And a fine pattern which is narrower than exposure wavelength is possible to form by using both a phase shift mask and new exposure with a wafer cover.

A fine gate pattern which is narrower than half oh exposure wavelength is possible to form by using a phase shift mask. A fine gate pattern is possible to form by exposing a narrow dark line which is interference of light by phase inverted the mask pattern. A narrow dark line of projection image of phase inverted boundary is printed as a gate pattern. The narrow dark line has to remain using an opaque mask. This exposure method has to expose both a phase shift mask and the opaque mask on the same photosensitive resist.

An n channel/photo step P5 is a step of forming a photosensitive resist pattern for covering the p-MOS FET forming region in order to ion-implant phosphorous, arsenic or the like onto the n-MOS FET forming region through the gate electrodes as the masks. For example, phosphorus or the arsenic is, in self-alignment, introduced into the n-MOS FET forming region through the gate electrodes as the masks by ion-implantation or the like. By using the gate electrodes as the self aligned the mask, accuracy of printing pattern can be done loosely.

Contrarily, a p channel/photo step P6 is a step of forming a photosensitive resist pattern for covering the n-MOS FET forming region in order to ion-implant boron or the like onto the p-MOS FET forming region through the gate electrodes as the masks. For example, boron is, in self-alignment, introduced into the n-MOS FET forming region through the gate electrodes as the masks by ion-implantation or the like. By using the gate electrodes as the self aligned the mask of forming region of p-type implantation to a semiconductor wafer W1, accuracy of printing pattern can be done loosely.

Then, source region and drain region of n-type and p-type semiconductor elements region are formed by heating process of semiconductor wafer W1.

A poly-crystal silicon/photo step p7 is a step of forming a photosensitive resist pattern for covering wiring and resistance regions on the poly-crystal silicon film deposited on the principal plane of the wafer in order to pattern a second poly-crystal silicon film which will be wiring or resistances. An interlayer dielectric made of, for example, a silicon oxide film is deposited on the principal plane of the wafer by CVD or the like, and then a poly-silicon film is deposited thereon by CVD or the like.

An R/photo step P8 is a step of using a negative process to pattern a photosensitive resist pattern used as a mask when, in the state that the photosensitive resist pattern is formed on the resistances, impurities are introduced into the other regions. The poly-silicon film is patterned by lithographic technique and etching technique, and then impurities are introduced into given regions of the patterned poly-silicon film. In this way, wiring and resistances formed of the poly-silicon film are formed.

A contact/photo step P9 is a step of depositing an interlayer dielectric (spin-on-glass (SOG) film), such as a silicon oxide film, on the principal plane of the wafer 12 by rotation coating or the like, and then forming a photosensitive resist pattern for forming contact holes by a positive process.

Inter-layer insulator film used of SOG (spin on glass) is planarizing by CMP (chemical mechanical polishing) in order to suppress the thickness fluctuation of under layer pattern densities and increase the accuracy of the exposure using a wafer cover. Another insulator such as CVD method is possible to form on The inter-layer insulator. Contact holes, and the wiring are partially exposed and are made in the interlayer insulator by lithographic technique and etching technique.

Figure 16:
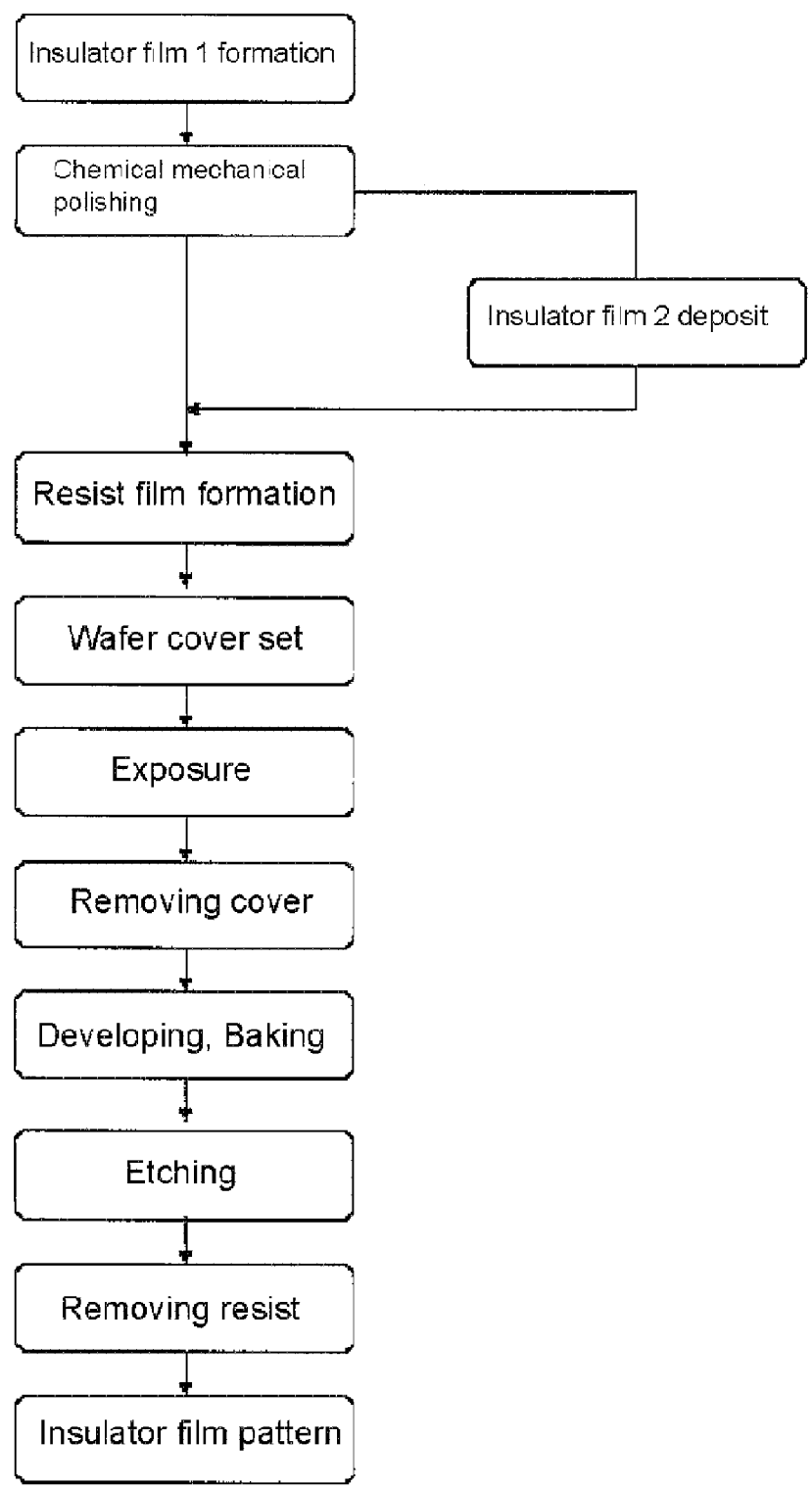
FIG. 16 is a flowchart of insulator film pattern formation of the semiconductor device.

FIG. 16 is a process flow of forming contact holes of insulator film. The feature of this process is little CD error of the contact holes pattern by proceeding a specific process. This specific process is a series of process such as a depositing process of insulator film, a planarizing process of insulator film, a depositing process of photosensitive resist film, a printing process of photosensitive resist film, a removing process of wafer cover, and a developing process of photosensitive resist film. This printing process is using a wafer cover.

After this step, a metal film made of, for example, tungsten is deposited on the principal plane of the wafer by sputtering or the like method. Thereafter, the metal film is polished by chemically polishing etching technique until the metal film except the metal film in the contact holes is removed. In this way, the metal film may be embedded in the contact holes.

An Al-1/photo step P10 is a step of depositing a metal film made of Al, Al alloy, Ti, TiNx or the like on the principal plane of the wafer by sputtering or the like, and then patterning this metal film as a first wiring layer.

Figure 17:
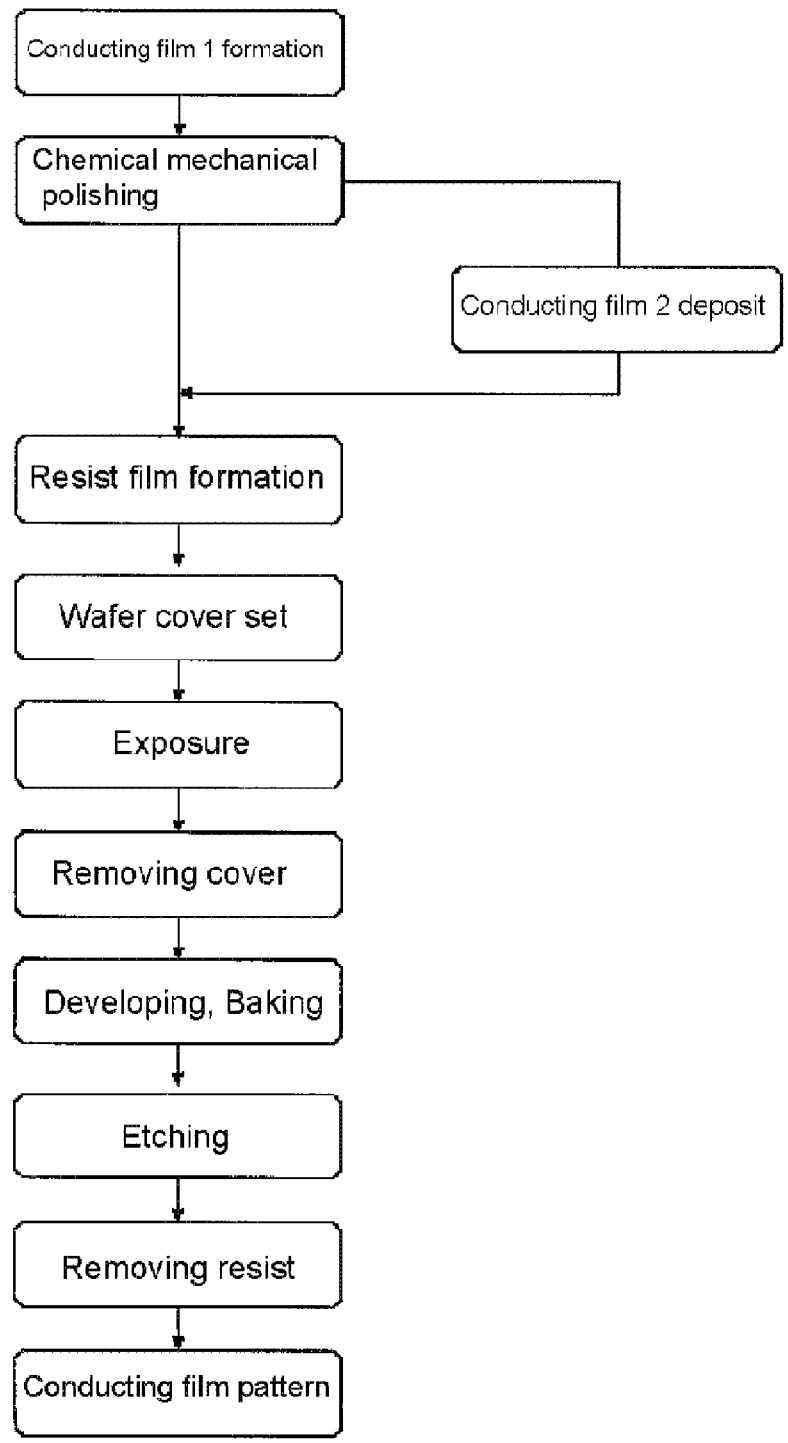
FIG. 17 is a flowchart of conductor film pattern formation of the semiconductor device.
Figure 18:
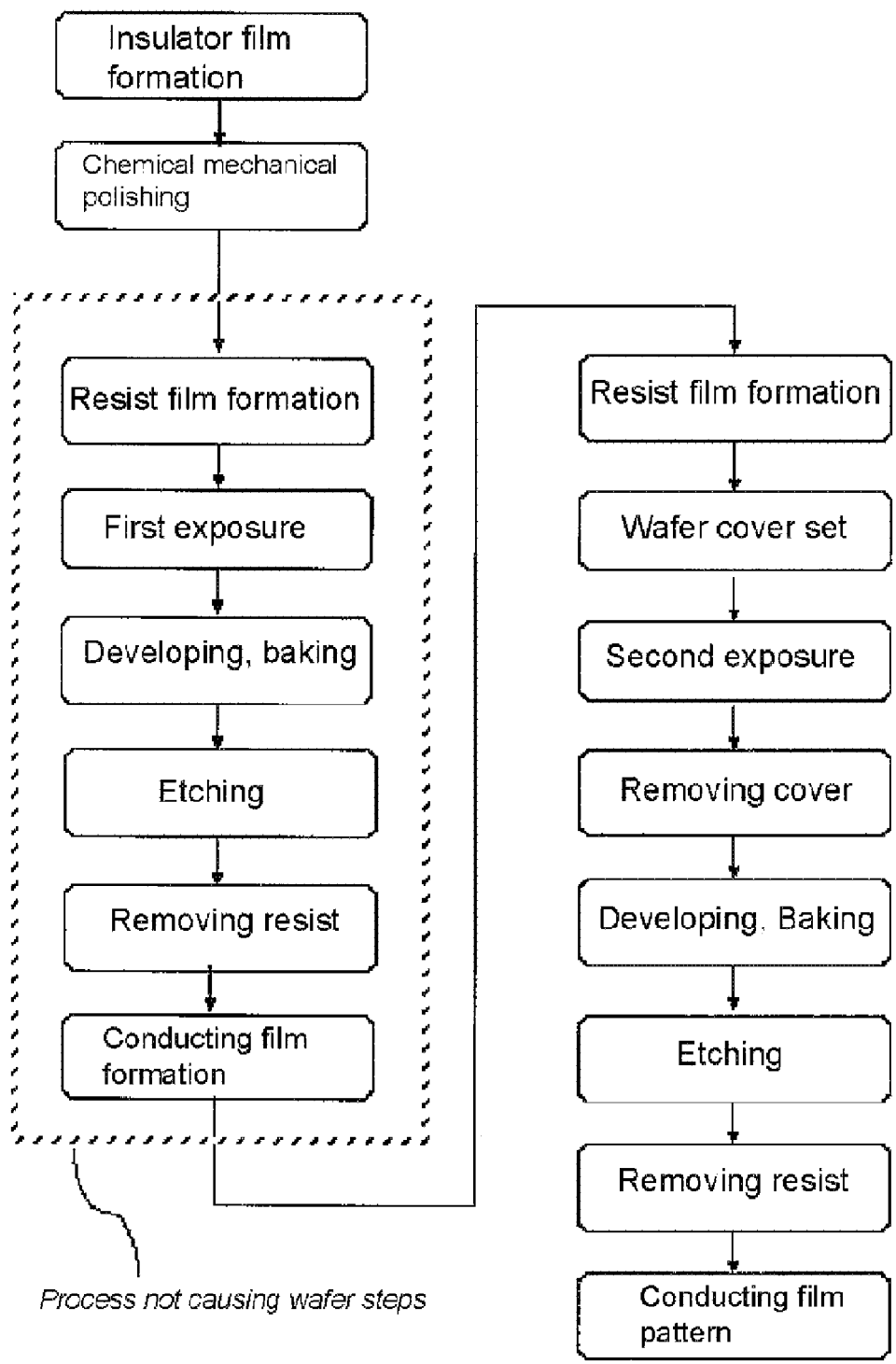
FIG. 18 is a flowchart of conductor film pattern formation of the semiconductor device.

FIG. 17 is a process flow of forming a first wiring layer. As shown in FIG. 17, a first wiring pattern is exposing with a wafer cover, after planarizing a conductor film and depositing a photosensitive resist film. The feature of this process is increasing of accuracy of circuit pattern by planarizing a conductor film and exposing with a wafer cover. And as shown in FIG. 18, after planarizing an insulator film, depositing a conductor film, and depositing a photosensitive resist film, a first wiring pattern is formed by printing a circuit pattern with a wafer cover.

The mask is using a phase shift mask when a circuit pattern size is less than a exposure wavelength. And the CD accuracy of printing pattern using a wafer cover is possible to increase by shortening exposure wavelength in a waver cover.

A through hole/photo step P11 is a step of forming a photosensitive resist pattern for making through holes for connecting the first wiring layer and a second wiring layer. An interlayer dielectric made of, for example, an silicon oxide is deposited on the principal plane of the wafer by CVD or the like, and then through holes are made in parts of the interlayer dielectric in the manner that parts of the first wiring layer are exposed.

A through-hole is an opening pattern of insulator film by using a specified process as shown in FIG. 16. The feature of this process is possible to increase a printing accuracy of circuit pattern by planarizing an insulator film, depositing a positive type photosensitive resist, and exposing with a wafer cover.

When a circuit pattern is less than exposure wavelength, phase shift mask was used. This phase shift mask is half tone film instead of opaque film as shown in FIG. 9. The resolution of printing pattern is increased by using this phase shift the mask and exposing with a wafer cover.

An Al-2/photo step P12 is a step of depositing a metal film made of, for example, Al or Al alloy on the principal plane of the wafer 12 by sputtering or the like, and then patterning this metal film as a second wiring layer. This process is the same as forming a first wiring layer.

A bonding pad/photo step P13 is a step of making openings having a diameter of about 100 μm and corresponding to bonding pads in a surface protective film, and is a step of forming, on the surface protective film, a photosensitive resist pattern for covering other than bonding pad forming regions. Thereafter, the surface protective film made of, for example, oxide silicon is deposited on the principal plane of the wafer by CVD or the like, so as to cover the second wiring layer.

In the n-well/photo step P1, the n-channel/photo step P5, the p-channel/photo step P6 and the bonding pad/photo step P13, among these exposure steps, the minimum size is relatively large. Therefore, the exposure is performed using conventional exposure method.

A fine wiring formation process whose pattern size is narrower than exposure wavelength is possible to increasing an accuracy of printing on conductor (metal) film by using a process of presenting FIG. 17 or FIG. 18. The first wiring layer is possible to increase a printing accuracy by using a phase shit the mask such as half tone phase shift mask. In FIG. 18, first exposure step for opening holes of insulator film after planarizing process is possible to adopt conventional exposure. It is possible to adopt exposure with a wafer cover. A wiring pattern on conductor film deposited over insulator film is used as a forming process of conductor film pattern as in FIG. 18. By this process, a fine conductor film pattern can be formed and increased its accuracy.

A contact/photo step P9 is a process of forming a contact hole using positive type resist of chemical amplification. An accuracy of a printing pattern is possible to increase by using a half tone phase shift mask with a mask cover.

Figure 19:
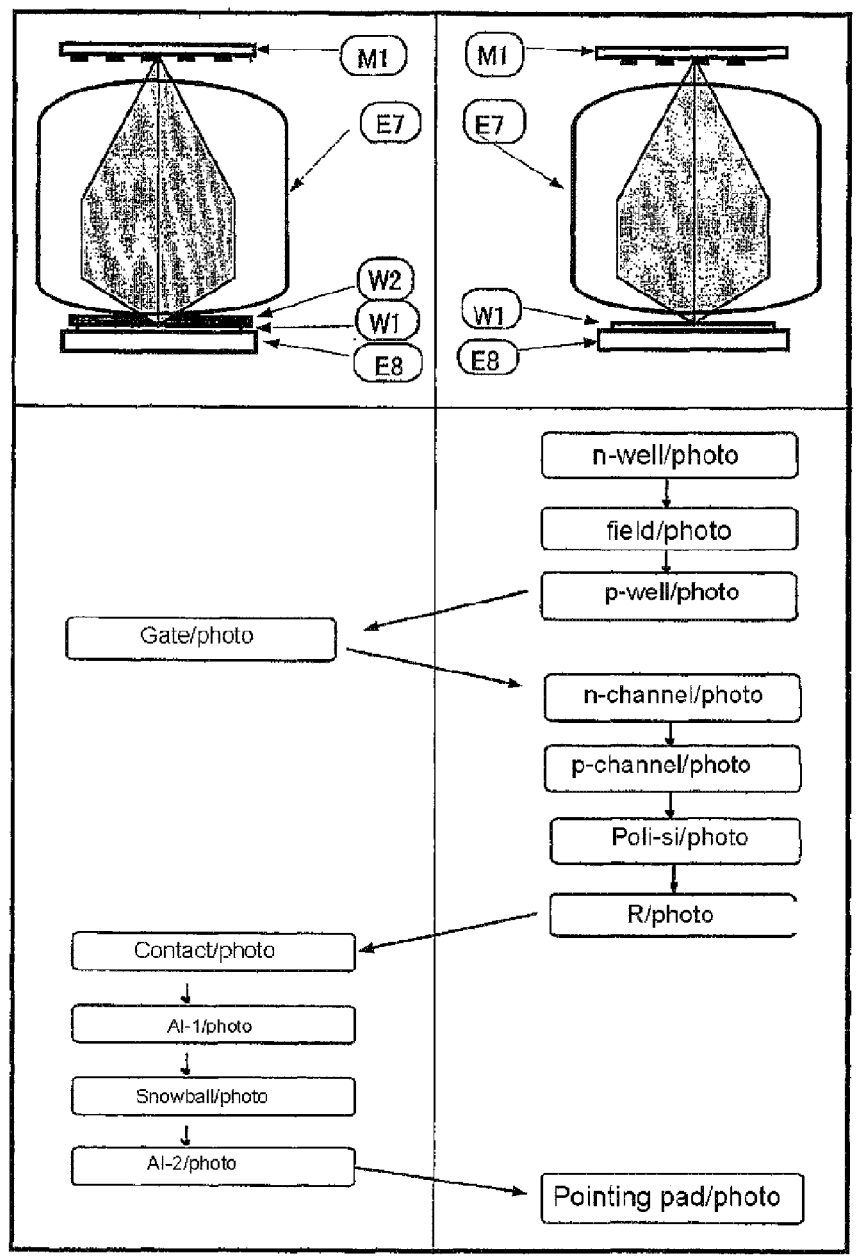
FIG. 19 is an explanatory semiconductor device using both an exposure method with a wafer cover and conventional method.

FIG. 19 is an explanatory semiconductor device fabrication method of both a circuit pattern formation process with a wafer cover and a circuit pattern formation process without a wafer cover. A fine circuit pattern is using a wafer cover. And rough scale pattern is not using a wafer cover.

The wafer cover of the present embodiment is using a quarts glass plate. This material has a high transmissivity for ArF (Argon Florid) laser light. For example, CaF2 glass plate is possible to use for F2 laser light. Selection of the mask cover material is high restriction compared with a wafer cover. Same material is used in this case.

Exposure time of photosensitive resist is increase when a wafer cover material is low transmissivity. In this case, temperature of a wafer cover is increasing with an absorption of exposure light. High transmissivity material is better for exposure time. A material of a wafer cover whose transmissivity is more than 80% for exposure light is possible to adopt such as a plastic plate or a poly-vinyl sheet.

A material which is different from a photosensitive resist is possible to use by following process. At first, material of wafer cover is depositing over a photosensitive resist film. After exposing a resist film, this material of wafer cover is removed. Then a circuit pattern of resist film is formed, after developing a resist film.

A reduced projection exposure method using a wafer cover and a mask with a mask cover was explained for a fabrication process of semiconductor integrated circuit. This exposure method is not limited to these combination. For example, a combination of a planarizing process of a semiconductor wafer and liquid immersion exposure method is possible to use of a fine pattern printing.

A planarizing process of an exposure sample can be suppressed micro bubbles by reducing irregular liquid stream during printing of immersion exposure on a roughness of an exposure sample.

When liquid is flowed on an exposure sample surface, and a little roughness (less than 1 micron) is existed on the sample surface, micro bubbles are usually generated in this liquid. These bubbles are distributing in the whirlpool called 'Calman' whirlpool. An exposure sample can be suppressed micro bubbles by adopting a planarizing process. And when liquid of immersion exposure is used water, The micro babul generation can be more suppressed by using boiling and cooling water.

And CML (chemical mechanical lapping) method is possible to use instead of CMP (chemical mechanical polishing) method as planarizing process of semiconductor wafer.

And this the mask is possible to adopt a OPC (optical proximity correction) method. This OPC is a resolution enhancement method of circuit pattern by reducing a printing pattern distortion. And it is possible to adopt a combination exposure method of a present invention the mask and liquid immersion exposure method.

Anti-refraction film may be used by coating a mask cover and a wafer cover of projection lens side surface. This film is able to reduce a effect of exposure light refraction.

The exposure equipment of the present invention is explained several lens as projection lens. A combination optics of aspferic surface mirror and lens is possible to use as a projection lens. And this the mask is explaining as a transparent type, and is possible to use a refracted type.

The above has mainly described cases in which the invention made by the inventors is applied to the embodiments. However, the present invention is not limited thereto, and can be applied.

The above has mainly described a method of manufacturing a semiconductor integrated circuit device having a CMOS circuit which is a field as the background of the invention. The present invention is not limited thereto, and may be applied to, for example, DRAM (Dynamic Random Access Memory), SRAM (Static Random Access Memory), or flash memory (electric erasable programmable read only memory (EEROM)). Furthermore, the present invention applies to a method of manufacturing a semiconductor integrated circuit device having a logic circuit such as a microprocessor, a method of manufacturing a consolidation type semiconductor integrated circuit device, in which a memory circuit as described the above and a logic circuit are mounted on the same semiconductor substrate or a method of manufacturing some other device such as a liquid display device or a micromachine.

This invention provides a simple method to solve an essential subject for semiconductor fabrication of very high density integration and a high possibility of semiconductor industry usage.

What is claimed is:

1. A semiconductor integrated circuit device fabrication method using an immersion exposure with a circuit pattern mask and a projection exposure equipment, comprising the steps of:
   forming an insulator film on a semiconductor wafer
      conducting a planarizing process including chemical mechanical polishing or chemical mechanical lapping to the insulator film;
      forming a photosensitive resist film on the insulator film; and
      setting a wafer cover including transparent liquid on the photosensitive resist film;
      wherein the planarizing process suppresses bubbles in the transparent liquid during the immersion exposure.

2. A semiconductor integrated circuit device fabrication method using an immersion exposure with a circuit pattern mask and a projection exposure equipment, comprising the steps of:
   forming a conductor film on a semiconductor wafer
      conducting a planarizing process including chemical mechanical polishing or chemical mechanical lapping to the conductor film;
      forming a photosensitive resist film on the conductor film and setting a wafer cover including transparent liquid on the photosensitive resist film;
      wherein the planarizing process suppresses bubbles in the transparent liquid during the immersion exposure.

3. A semiconductor integrated circuit device fabrication method using an immersion exposure with a circuit pattern mask and a projection exposure equipment, comprising the steps of:
   forming an insulator film on a semiconductor wafer;
   conducting a planarizing process including chemical mechanical polishing or chemical mechanical lapping to the insulator film;
   forming
      a conductor film formed on the insulator film;
      forming a photosensitive resist film on said conductor film;
      setting a wafer cover including transparent liquid on the photosensitive resist film
      wherein the planarizing process suppresses bubbles in the transparent liquid during the immersion exposure.

4. A semiconductor integrated circuit device fabrication method using a circuit pattern mask and a projection exposure equipment, comprising the steps of:
   (1) preparing a conventional mask data consisted of circuit pattern formed by conventional exposure equipment which numerical aperture of the projection lens is smaller than 1;
   (2) forming circuit pattern on second mask by using a mask data of additional conversion from a conventional mask data;
   (3) setting a wafer cover including either transparent liquid, glass plate or polymer plastic contacted to a photosensitive resist film over a semiconductor wafer;
   (4) printing the photosensitive resist on a semiconductor wafer by using above second mask and projection exposure equipment of same exposure wavelength;
   (5) forming the circuit pattern, after removing above wafer cover and developing a photosensitive resist film.

5. A semiconductor integrated circuit device fabrication method as recited in claim 4: wherein said additional conversion is reduced similarity form of conventional circuit pattern of reduced rate up to 0.5 times.

6. A semiconductor integrated circuit device fabrication method as recited in claim 4: wherein said additional conversion of circuit pattern is only opaque pattern instead of phase shift mask which is using both phase shift pattern and opaque pattern.

7. A semiconductor integrated circuit device fabrication method using a circuit pattern mask and a projection exposure equipment, comprising the steps of:
   (1) forming the circuit pattern on a mask by designing a pattern for the case that numerical aperture of projection lens being bigger than 1, and exposure wavelength being either 193 nm or 157 nm;
   (2) setting a wafer cover including ether transparent liquid, glass plate or polymer plastic between said projection lens and the wafer;
   (3) printing a pattern on a photosensitive resist film over a semiconductor wafer, after illuminating the mask, and passing exposure light through the projection lens and the wafer cover;
   (4) forming circuit pattern on the semiconductor wafer, after removing said wafer cover and a developing photosensitive resist film.

* * * * *